(12) United States Patent
Lin et al.

(10) Patent No.: US 12,080,759 B2
(45) Date of Patent: Sep. 3, 2024

(54) TRANSISTOR SOURCE/DRAIN REGIONS AND METHODS OF FORMING THE SAME

(71) Applicant: Taiwan Semiconductor Manufacturing Co., Ltd., Hsinchu (TW)

(72) Inventors: Yan-Ting Lin, Baoshan Township (TW); Wei-Jen Lai, Keelung (TW); Chien-I Kuo, Chiayi County (TW); Wei-Yuan Lu, Taipei (TW); Chia-Pin Lin, Xinpu Township (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 379 days.

(21) Appl. No.: 17/530,026

(22) Filed: Nov. 18, 2021

(65) Prior Publication Data

US 2022/0367622 A1    Nov. 17, 2022

Related U.S. Application Data

(60) Provisional application No. 63/188,130, filed on May 13, 2021.

(51) Int. Cl.
*H01L 21/00* (2006.01)
*H01L 21/8234* (2006.01)
*H01L 29/06* (2006.01)
*H01L 29/423* (2006.01)
(Continued)

(52) U.S. Cl.
CPC .. *H01L 29/0665* (2013.01); *H01L 21/823468* (2013.01); *H01L 29/42392* (2013.01); *H01L 29/6656* (2013.01); *H01L 29/66742* (2013.01); *H01L 29/78618* (2013.01); *H01L 29/78696* (2013.01)

(58) Field of Classification Search
CPC ......... H01L 29/0665; H01L 21/823468; H01L 29/42392; H01L 29/6656; H01L 29/66742; H01L 29/78618; H01L 29/78696
See application file for complete search history.

(56) References Cited

U.S. PATENT DOCUMENTS 9,206,247 B2 * 12/2015 Beaumont ............... C07K 16/00
9,472,618 B2 * 10/2016 Oxland ............. H01L 29/78696
9,520,482 B1 * 12/2016 Chang ............. H01L 21/823864
(Continued)

OTHER PUBLICATIONS

Hartmann, J.M., et al., "Growth Kinetics and Boron-Doping of Very High Ge content Si1-xGex for Source and Drain Engineering," ECS Transactions, vol. 6, 2007, pp. 397-400.

*Primary Examiner* — Richard A Booth
(74) *Attorney, Agent, or Firm* — Slater Matsil, LLP

(57) ABSTRACT

In an embodiment, a device includes: a nanostructure; and a source/drain region adjoining a channel region of the nanostructure, the source/drain region including: a first epitaxial layer on a sidewall of the nanostructure, the first epitaxial layer including a germanium-free semiconductor material and a p-type dopant; a second epitaxial layer on the first epitaxial layer, the second epitaxial layer including a germanium-containing semiconductor material and the p-type dopant; and a third epitaxial layer on the second epitaxial layer, the third epitaxial layer including the germanium-containing semiconductor material and the p-type dopant.

20 Claims, 32 Drawing Sheets

(51) Int. Cl.
*H01L 29/66* (2006.01)
*H01L 29/786* (2006.01)

(56) References Cited

U.S. PATENT DOCUMENTS 9,608,116 B2 * 3/2017 Ching .................. H01L 21/283
2020/0044045 A1 2/2020 Wang et al.

* cited by examiner

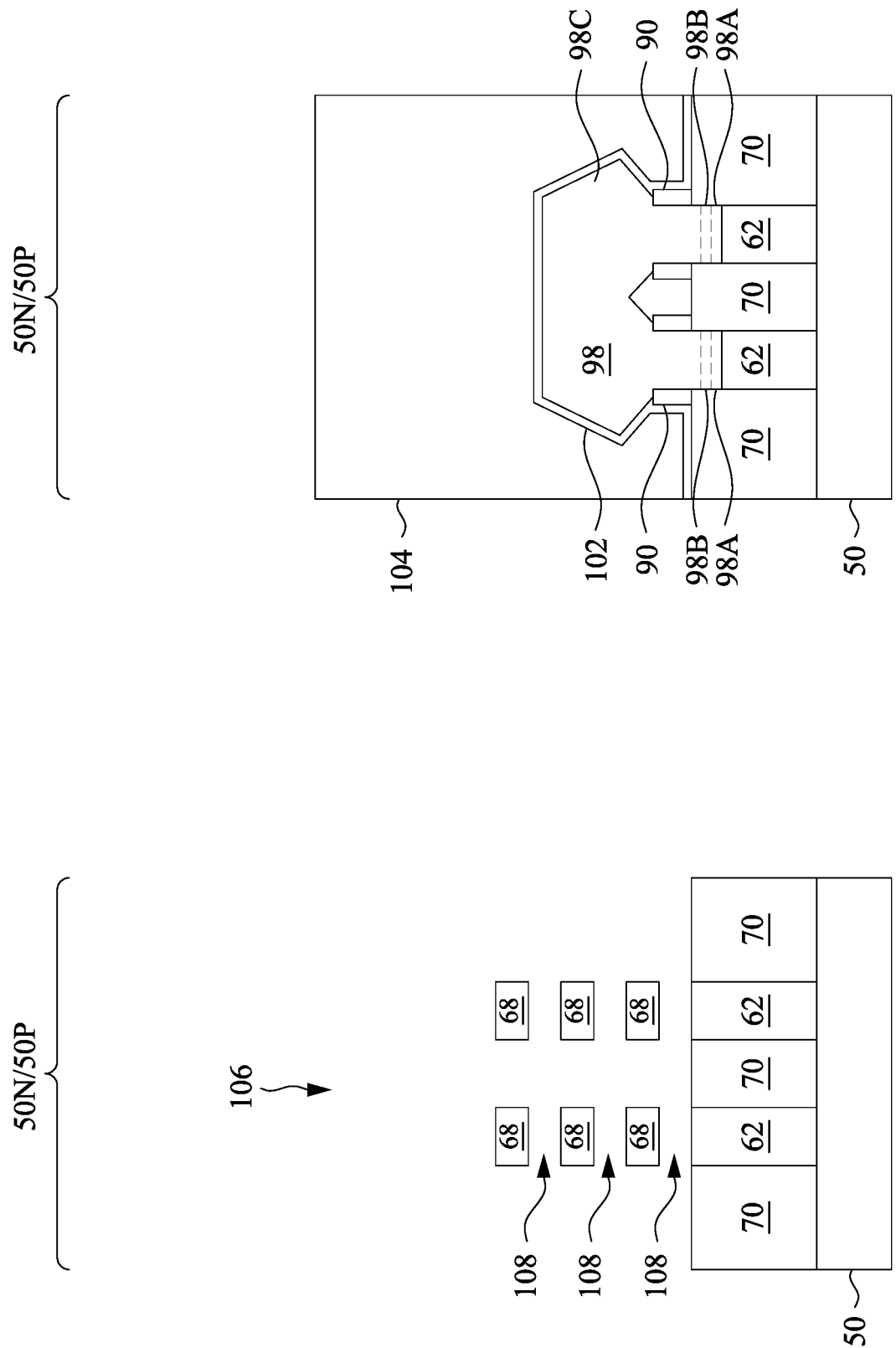

TRANSISTOR SOURCE/DRAIN REGIONS AND METHODS OF FORMING THE SAME

PRIORITY CLAIM AND CROSS-REFERENCE

This application claims the benefit of U.S. Provisional Application No. 63/188,130, filed on May 13, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
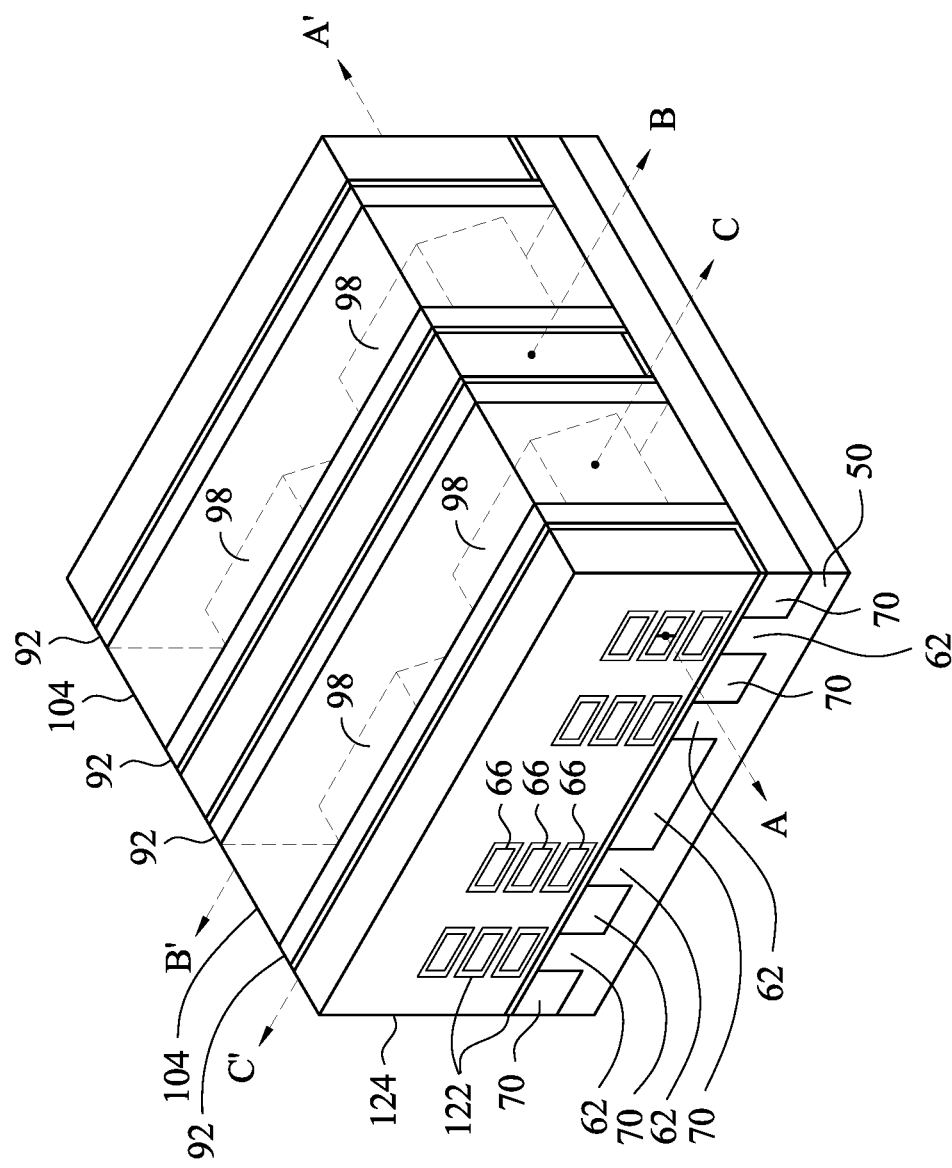
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, source/drain regions for p-type devices are epitaxially grown with seed layers. The seed layers include a semiconductor material that allows subsequently-grown lightly-doped epitaxial layers to have a lower bottom-up growth rate. The volume available for highly-doped epitaxial layers may thus be increased. The resistance of the epitaxial source/drain regions 98 may therefore be decreased, improving device performance.

Embodiments are described in a particular context, a die including nano-FETs. Various embodiments may be applied, however, to dies including other types of transistors (e.g., fin field-effect transistors (finFETs), planar transistors, or the like) in lieu of or in combination with the nano-FETs.

FIG. 1 illustrates an example of nano-FETs (e.g., nanowire FETs, nanosheet FETs, or the like), in accordance with some embodiments. FIG. 1 is a three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nanostructures 66 (e.g., nanosheets, nanowires, or the like) over fins 62 on a substrate 50 (e.g., a semiconductor substrate), with the nanostructures 66 acting as channel regions for the nano-FETs. The nanostructures 66 may include p-type nanostructures, n-type nanostructures, or a combination thereof. Isolation regions 70, such as shallow trench isolation (STI) regions, are disposed between adjacent fins 62, which may protrude above and from between adjacent isolation regions 70. Although the isolation regions 70 are described/illustrated as being separate from the substrate 50, as used herein, the term "substrate" may refer to the semiconductor substrate alone or a combination of the semiconductor substrate and the isolation regions. Additionally, although a bottom portion of the fins 62 are illustrated as being single, continuous materials with the substrate 50, the bottom portion of the fins 62 and/or the substrate 50 may include a single material or a plurality of materials. In this context, the fins 62 refer to the portion extending above and from between the adjacent isolation regions 70.

Gate dielectrics 122 are over top surfaces of the fins 62 and wrapped around the top surfaces, sidewalls, and bottom surfaces of the nanostructures 66. Gate electrodes 124 are over and wrapped around the gate dielectrics 122. Epitaxial source/drain regions 98 are disposed on the fins 62 at opposing sides of the gate dielectrics 122 and the gate electrodes 124. An inter-layer dielectric (ILD) 104 is formed over the epitaxial source/drain regions 98. Source/drain contact (subsequently described) to the epitaxial source/drain regions 98 are formed through the ILD 104. The epitaxial source/drain regions 98 may be shared between various nanostructures 66 and fins 62. For example, adjacent epitaxial source/drain regions 98 may be electrically connected, such as through coalescing the epitaxial source/drain regions 98 by epitaxial growth, or through coupling the epitaxial source/drain regions 98 with a same source/drain contact.

FIG. 1 further illustrates reference cross-sections that are used in later figures. Cross-section A-A' is along a longitudinal axis of a fin 62 and in a direction of, for example, a current flow between the epitaxial source/drain regions 98 of a nano-FET. Cross-section B-B' is along a longitudinal axis of a gate electrode 124 and in a direction, for example, perpendicular to a direction of current flow between the epitaxial source/drain regions 98 of a nano-FET. Cross-section C-C' is parallel to cross-section B-B' and extends through epitaxial source/drain regions 98 of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (finFETs).

FIGS. 2-22C are views of intermediate stages in the manufacturing of nano-FETs, in accordance with some embodiments. FIGS. 2-6 are three-dimensional views showing a similar three-dimensional view as FIG. 1. FIGS. 7A, 8A, 9A, 10A, 10B, 10C, 11A, 12, 13, 14, 15, 16, 17A, 18A, 19A, 20A, 21A, and 22A illustrate reference cross-section A-A' illustrated in FIG. 1. FIGS. 7B, 8B, 9B, 11B, 17B, 18B, 19B, 20B, 21B, and 22B illustrate reference cross-section B-B' illustrated in FIG. 1. FIGS. 7C, 8C, 9C, 11C, 17C, 18C, 19C, 20C, 21C, and 22C illustrate reference cross-section C-C' illustrated in FIG. 1.

Figure 2:
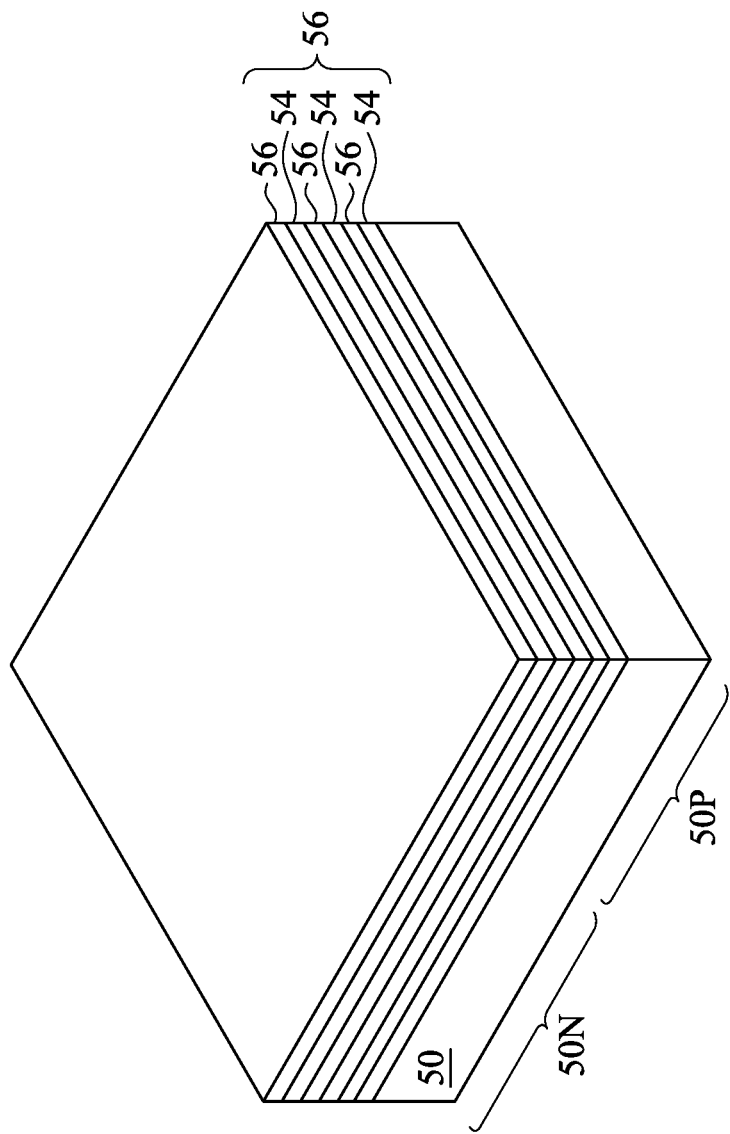
FIGS. 2-22C are views of intermediate stages in the manufacturing of nano-FETs, in accordance with some embodiments.

In FIG. 2, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region. During the APT implantation, impurities may be implanted in the substrate 50. The impurities may have a conductivity type opposite from a conductivity type of source/drain regions that will be subsequently formed in each of the n-type region 50N and the p-type region 50P. The APT region may extend under the source/drain regions in the nano-FETs. The APT region may be used to reduce the leakage from the source/drain regions to the substrate 50. In some embodiments, the impurity concentration in the APT region may be in the range of $10^{18}$ $cm^{-3}$ to $10^{19}$ $cm^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three layers of each of the first semiconductor layers 54 and the second semiconductor layers 56. It should be appreciated that the multi-layer stack 52 may include any number of the first semiconductor layers 54 and the second semiconductor layers 56.

In the illustrated embodiment, and as will be subsequently described in greater detail, the first semiconductor layers 54 will be removed and the second semiconductor layers 56 will patterned to form channel regions for the nano-FETs in both the n-type region 50N and the p-type region 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nano-FETs in one region (e.g., the p-type region 50P), and the second semiconductor layers 56 will be patterned to form channel regions for nano-FETs in another region (e.g., the n-type region 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56 in the n-type region 50N, and the second semiconductor layers 56 may be removed without removing the first semiconductor layers 54 in the p-type region 50P.

Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. Each of the layers may have a small thickness, such as a thickness in a range of 5 nm to 30 nm. In some embodiments, some layers of the multi-layer stack 52 (e.g., the second semiconductor layers 56) are formed to be thinner than other layers of the multi-layer stack 52 (e.g., the first semiconductor layers 54).

Figure 3:
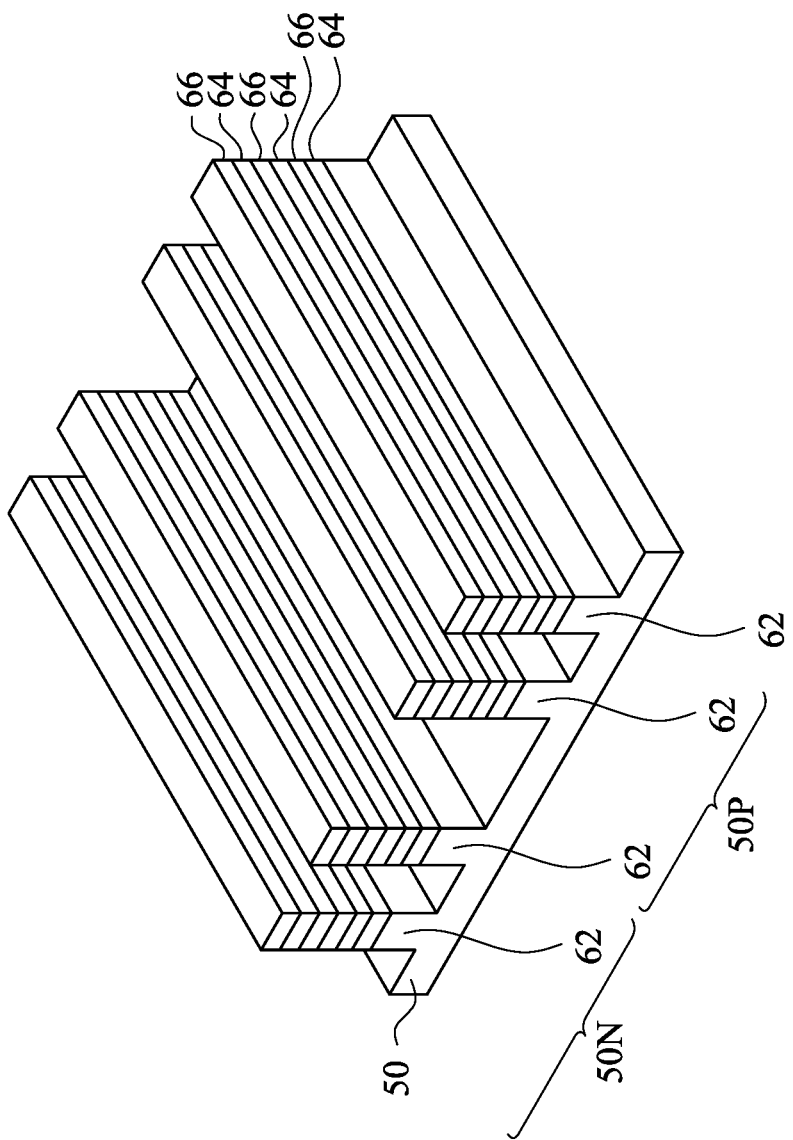

In FIG. 3, trenches are patterned in the substrate 50 and the multi-layer stack 52 to form fins 62, first nanostructures 64, and second nanostructures 66. The fins 62 are semiconductor strips patterned in the substrate 50. The first nanostructures 64 and the second nanostructures 66 include the remaining portions of the first semiconductor layers 54 and the second semiconductor layers 56, respectively. The trenches may be patterned by any acceptable etch process, such as a reactive ion etch (RIE), neutral beam etch (NBE), the like, or a combination thereof. The etching may be anisotropic.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 62 and the nanostructures 64, 66. In some embodiments, the mask (or other layer) may remain on the nanostructures 64, 66.

The fins 62 and the nanostructures 64, 66 may each have widths in a range of 8 nm to 40 nm. In the illustrated embodiment, the fins 62 and the nanostructures 64, 66 have substantially equal widths in the n-type region 50N and the p-type region 50P. In another embodiment, the fins 62 and the nanostructures 64, 66 in one region (e.g., the n-type region 50N) are wider or narrower than the fins 62 and the nanostructures 64, 66 in another region (e.g., the p-type region 50P).

Figure 4:
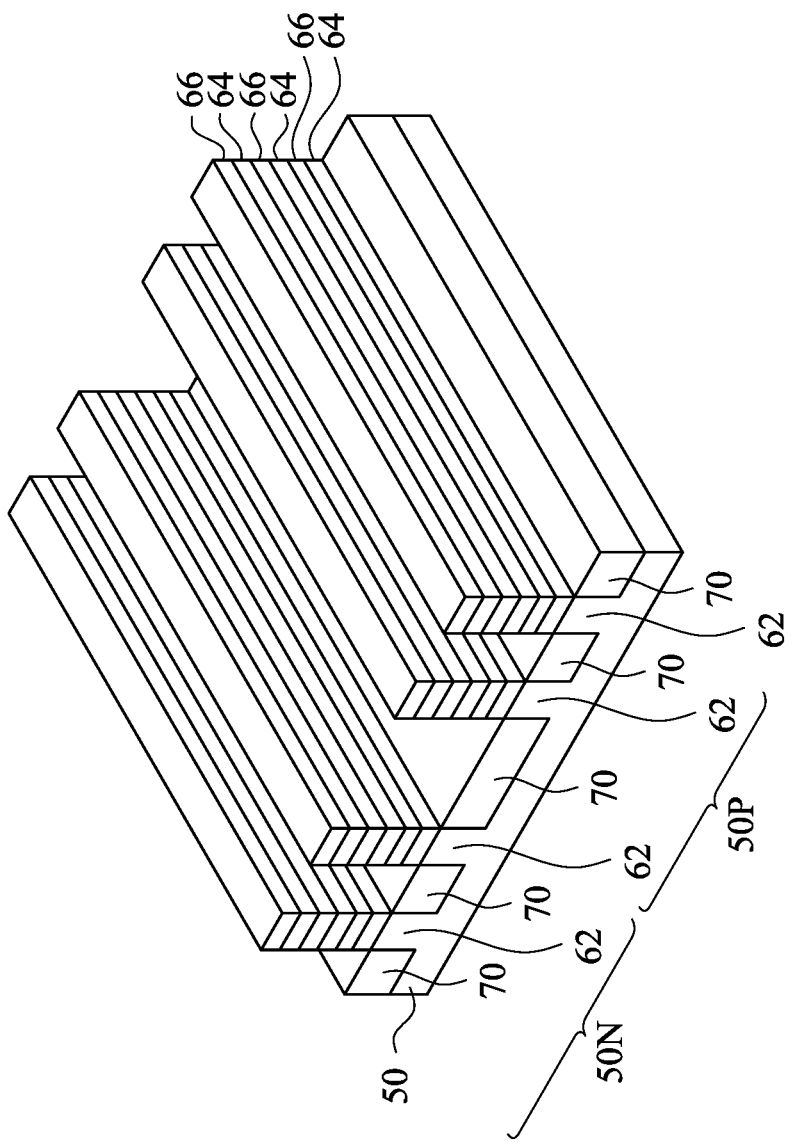

In FIG. 4, STI regions 70 are formed over the substrate 50 and between adjacent fins 62. The STI regions 70 are disposed around at least a portion of the fins 62 such that at least a portion of the nanostructures 64, 66 protrude from between adjacent STI regions 70. In the illustrated embodiment, the top surfaces of the STI regions 70 are coplanar (within process variations) with the top surfaces of the fins 62. In some embodiments, the top surfaces of the STI regions 70 are above or below the top surfaces of the fins 62. The STI regions 70 separate the features of adjacent devices.

The STI regions 70 may be formed by any suitable method. For example, an insulation material can be formed over the substrate 50 and the nanostructures 64, 66, and between adjacent fins 62. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the STI regions 70 are each illustrated as a single layer, some embodiments may utilize multiple layers. For example, in some embodiments a liner (not separately illustrated) may first be formed along surfaces of the substrate 50, the fins 62, and the nanostructures 64, 66. Thereafter, a fill material, such as those previously described may be formed over the liner.

A removal process is then applied to the insulation material to remove excess insulation material over the nanostructures 64, 66. In some embodiments, a planarization process such as a chemical mechanical polish (CMP), an etch-back process, combinations thereof, or the like may be utilized. In embodiments in which a mask remains on the nanostructures 64, 66, the planarization process may expose the mask or remove the mask. After the planarization process, the top surfaces of the insulation material and the mask (if present) or the nanostructures 64, 66 are coplanar (within process variations). Accordingly, the top surfaces of the mask (if present) or the nanostructures 64, 66 are exposed through the insulation material. In the illustrated embodiment, no mask remains on the nanostructures 64, 66. The insulation material is then recessed to form the STI regions 70. The insulation material is recessed such that at least a portion of the nanostructures 64, 66 protrude from between adjacent portions of the insulation material. Further, the top surfaces of the STI regions 70 may have a flat surface as illustrated, a convex surface, a concave surface (such as dishing), or a combination thereof. The top surfaces of the STI regions 70 may be formed flat, convex, and/or concave by an appropriate etch. The insulation material may be recessed using any acceptable etching process, such as one that is selective to the material of the insulation material (e.g., selectively etches the insulation material of the STI regions 70 at a faster rate than the materials of the fins 62 and the nanostructures 64, 66). For example, an oxide removal may be performed using dilute hydrofluoric (dHF) acid.

The process previously described is just one example of how the fins 62 and the nanostructures 64, 66 may be formed. In some embodiments, the fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the nanostructures 64, 66, the fins 62, and/or the substrate 50 by doping (e.g., with a p-type or an n-type impurity). The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using mask (not separately illustrated) such as a photoresist. For example, a photoresist may be formed over the fins 62, the nanostructures 64, 66, and the STI regions 70 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ cm$^{-3}$ to $10^{14}$ cm$^{-3}$. After the implant, the photoresist may be removed, such as by any acceptable ashing process.

Following or prior to the implanting of the p-type region 50P, a mask (not separately illustrated) such as a photoresist is formed over the fins 62, the nanostructures 64, 66, and the STI regions 70 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ cm$^{-3}$ to $10^{14}$ cm$^{-3}$. After the implant, the photoresist may be removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the fins 62 and/or the nanostructures 64, 66, the grown materials may be in situ doped during growth, which may obviate the implantations, although in situ and implantation doping may be used together.

Figure 5:
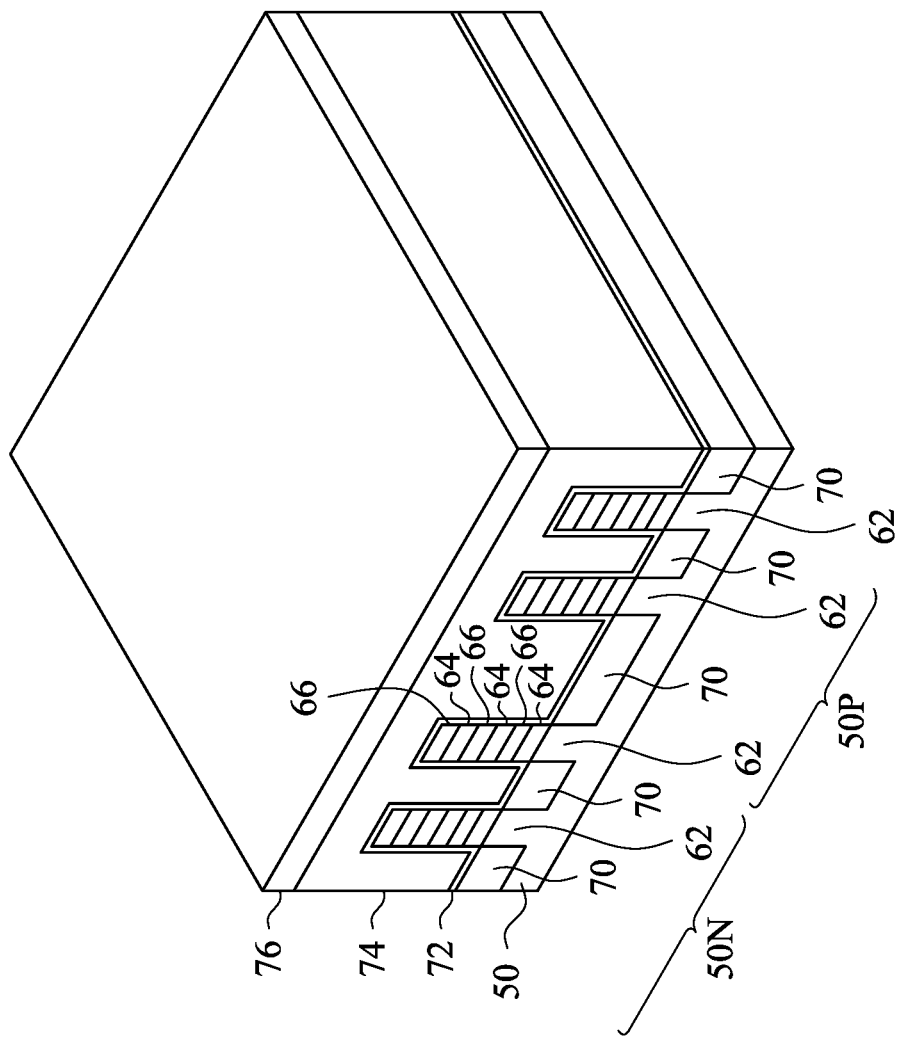

In FIG. 5, a dummy dielectric layer 72 is formed on the fins 62 and the nanostructures 64, 66. The dummy dielectric layer 72 may be formed of a dielectric material such as silicon oxide, silicon nitride, a combination thereof, or the like, which may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The dummy gate layer 74 may be formed of a conductive or non-conductive material, such as amorphous silicon, polycrystalline-silicon (polysilicon), poly-crystalline silicon germanium (poly-SiGe), a metal, a metallic nitride, a metallic silicide, a metallic oxide, or the like, which may be deposited by physical vapor deposition (PVD), CVD, or the like. The dummy gate layer 74 may be formed of material(s) that have a high etching selectivity from the etching of insulation materials, e.g., the STI regions 70 and/or the dummy dielectric layer 72. The mask layer 76 may be deposited over the dummy gate layer 74. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the fins 62, the nanostructures 64, 66, and the STI regions 70, such that the dummy dielectric layer 72 extends over the STI regions 70 and between the dummy gate layer 74 and the STI regions 70. In another embodiment, the dummy dielectric layer 72 covers only the fins 62 and the nanostructures 64, 66.

Figure 6:
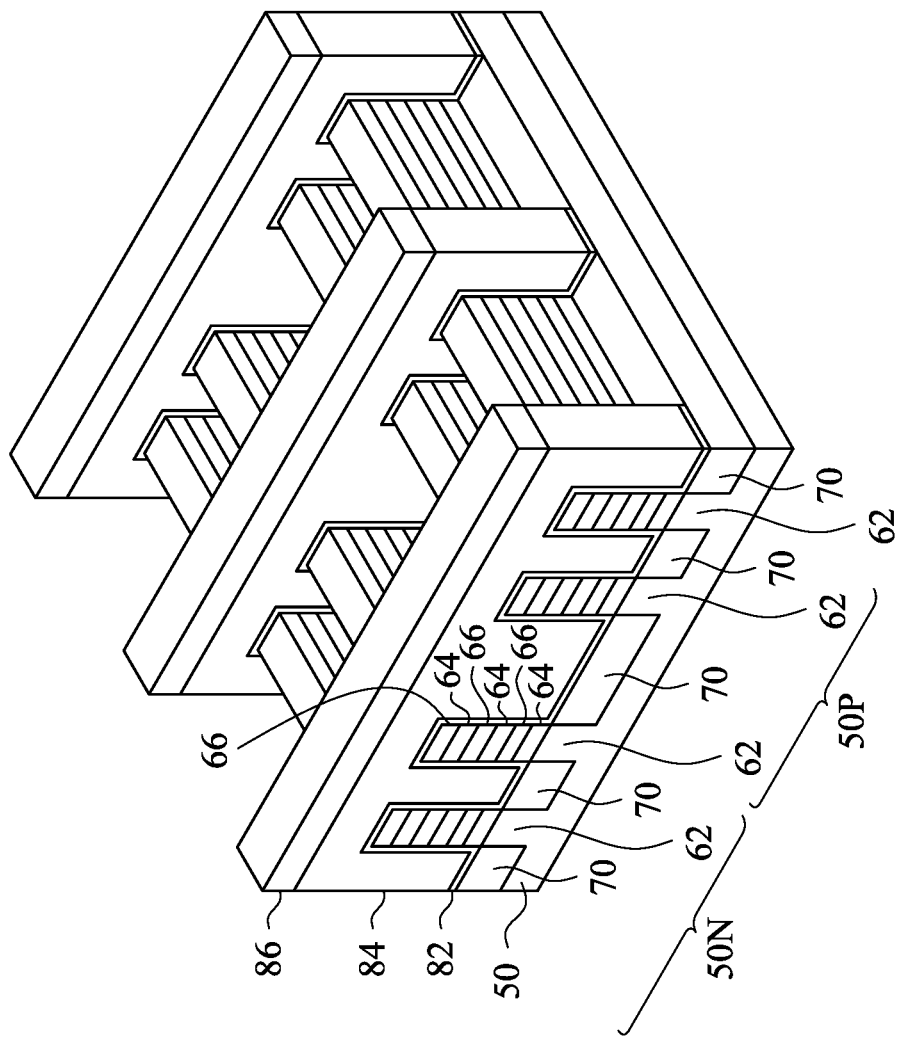

In FIG. 6, the mask layer 76 is patterned using acceptable photolithography and etching techniques to form masks 86. The pattern of the masks 86 is then transferred to the dummy gate layer 74 by any acceptable etching technique to form dummy gates 84. The pattern of the masks 86 may optionally be further transferred to the dummy dielectric layer 72 by any acceptable etching technique to form dummy dielectrics 82. The dummy gates 84 cover portions of the nanostructures 64, 66 that will be exposed in subsequent processing to form channel regions. Specifically, the dummy gates 84 extend along the portions of the second nanostructures 66 that will be patterned to form channel regions 68. The pattern of the masks 86 may be used to physically separate adjacent dummy gates 84. The dummy gates 84 may also have lengthwise directions substantially perpendicular (within process variations) to the lengthwise directions of the fins 62. The masks 86 can optionally be removed after patterning, such as by any acceptable etching technique.

FIGS. 7A-22C illustrate various additional steps in the manufacturing of embodiment devices. FIGS. 7A-9C, 11A-11C, and 17A-22C illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are explained in the description accompanying each figure.

Figure 7A:
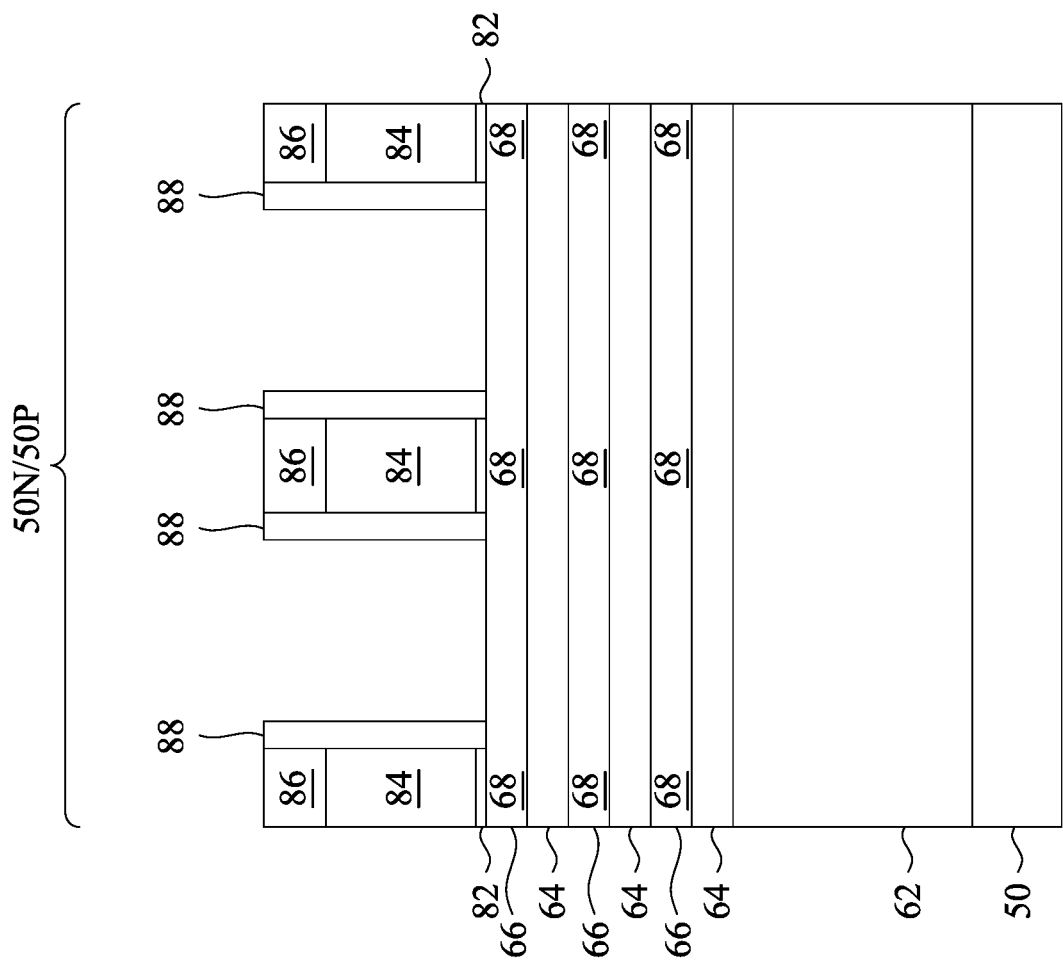
Figure 7C:
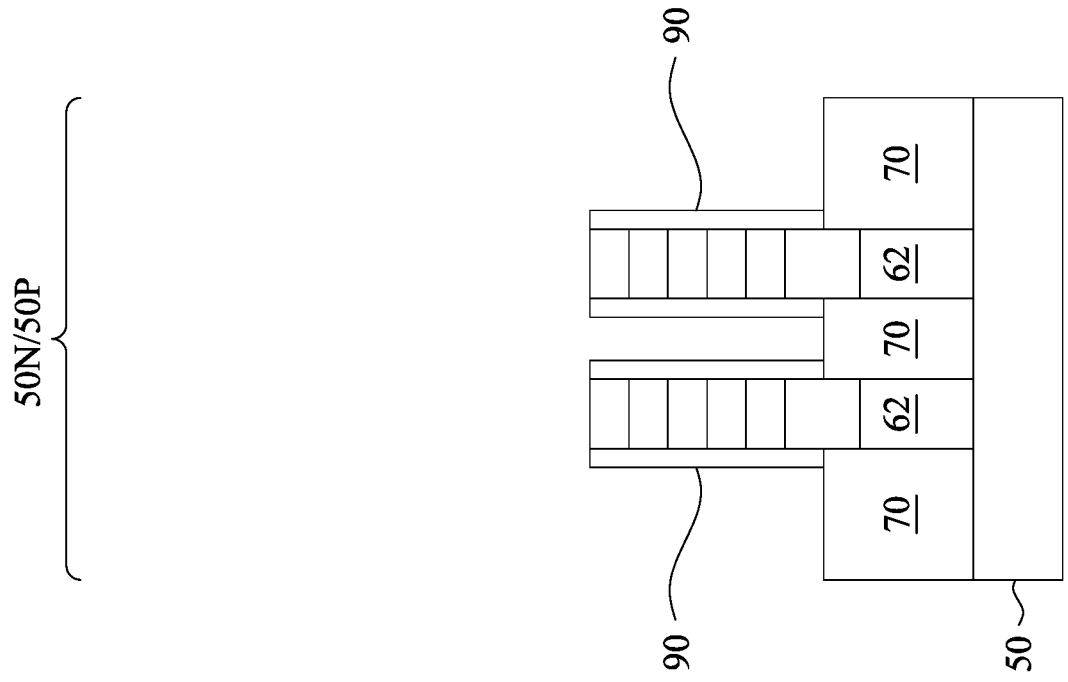
Figure 7B:
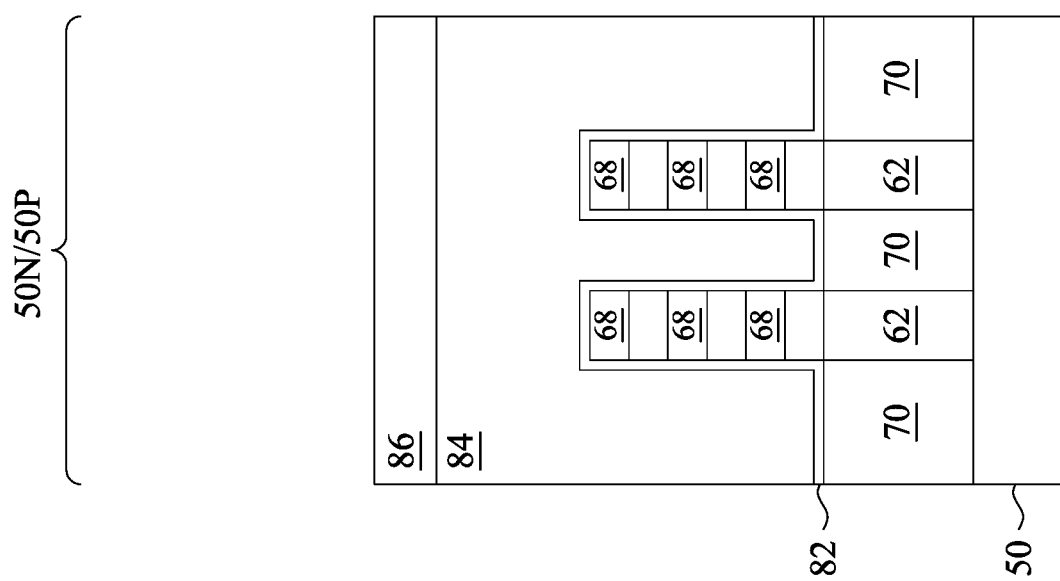

In FIGS. 7A-7C, gate spacers 88 are formed over the nanostructures 64, 66, on exposed sidewalls of the masks 86 (if present), the dummy gates 84, and the dummy dielectrics 82. The gate spacers 88 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 88). The dielectric material(s), when etched, may also have portions left on the sidewalls of the fins 62 and/or the nanostructures 64, 66 (thus forming fin spacers 90). After etching, the fin spacers 90 (if present) and the gate spacers 88 can have straight sidewalls (as illustrated) or can have curved sidewalls (not separately illustrated).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 62 and/or the nanostructures 64, 66 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the fins 62 and/or the nanostructures 64, 66 exposed in the n-type region 50N. The mask may then be removed. The n-type impurities may be any of the n-type impurities previously described, and the p-type impurities may be any of the p-type impurities previously described. During the implanting, the channel regions 68 remain covered by the dummy gates 84, so that the channel regions 68 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 8A:
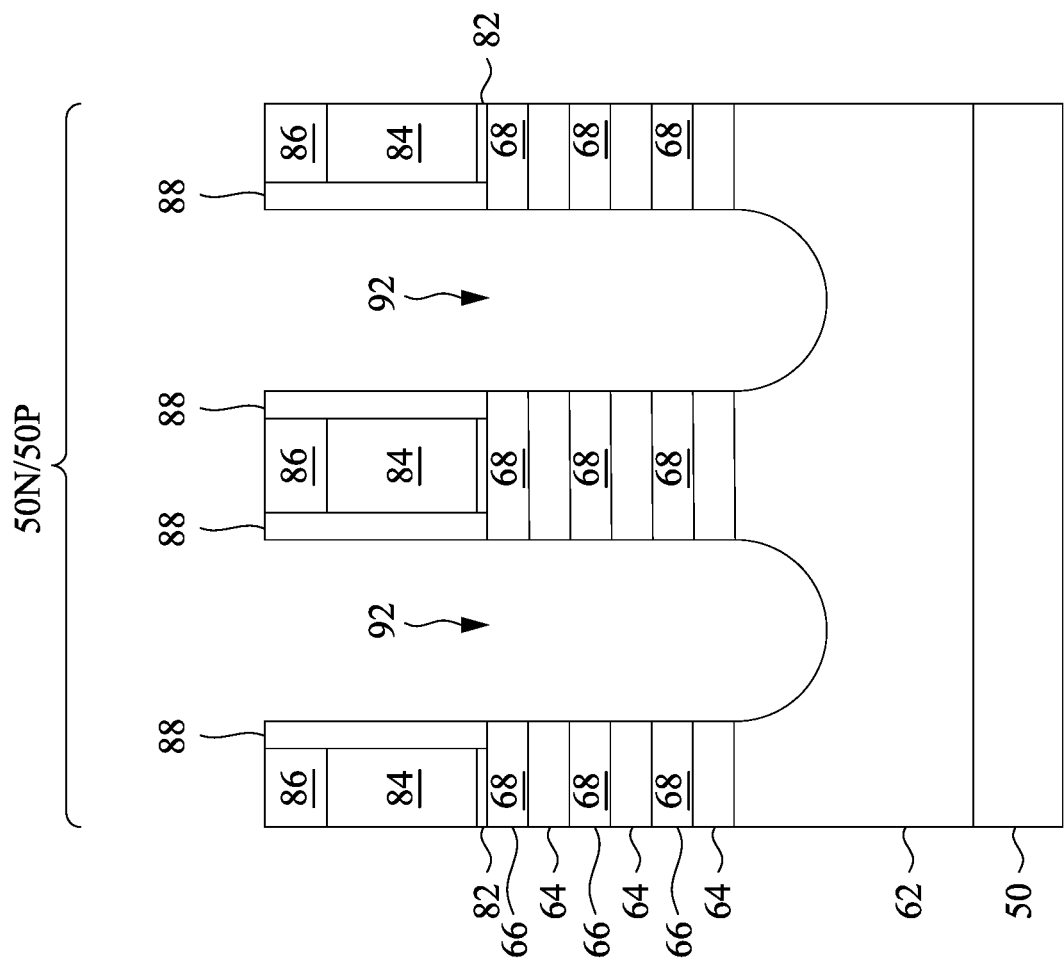
Figure 8C:
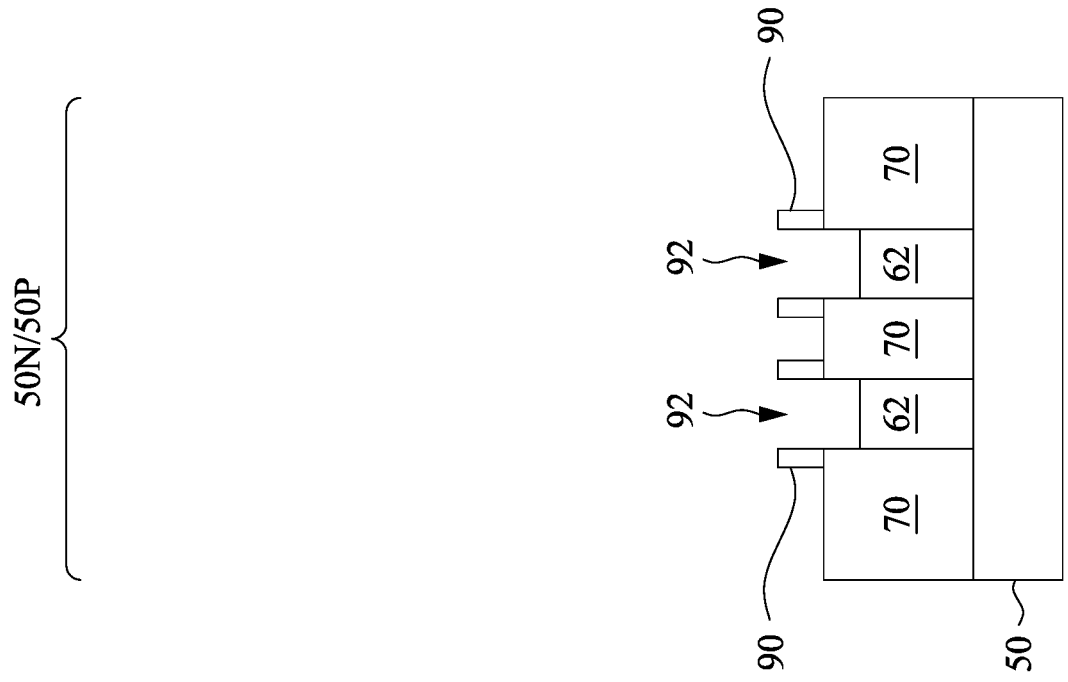
Figure 8B:
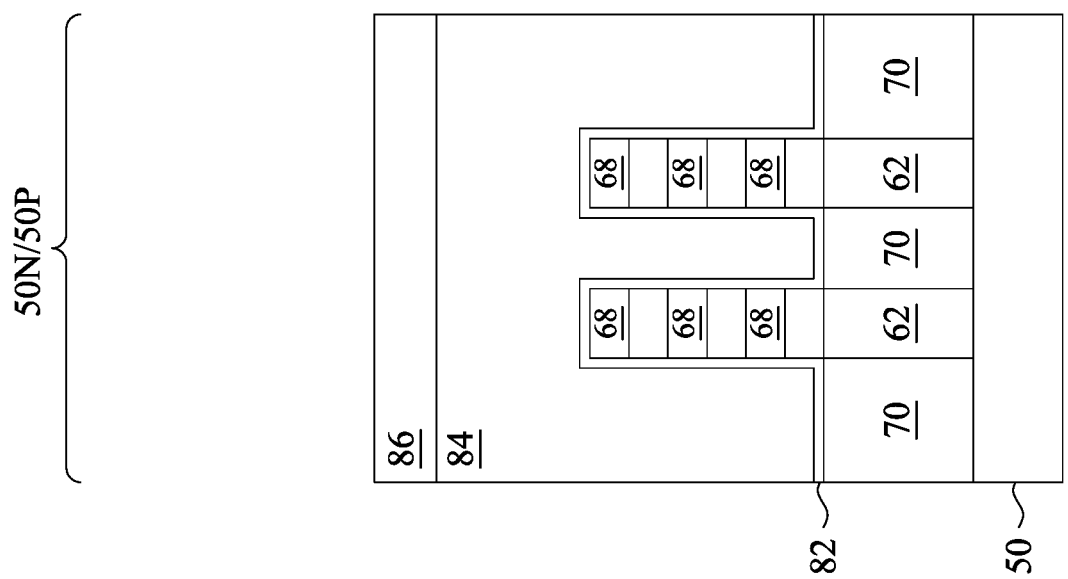

In FIGS. 8A-8C, source/drain recesses 92 are formed in the nanostructures 64, 66. In the illustrated embodiment, the source/drain recesses 92 extend through the nanostructures 64, 66 and into the fins 62. The source/drain recesses 92 may also extend into the substrate 50. In various embodiments, the source/drain recesses 92 may extend to a top surface of the substrate 50 without etching the substrate 50; the fins 62 may be etched such that bottom surfaces of the source/drain recesses 92 are disposed below the top surfaces of the STI regions 70; or the like. The source/drain recesses 92 may be formed by etching the nanostructures 64, 66 using an anisotropic etching processes, such as a RIE, a NBE, or the like. The gate spacers 88 and the dummy gates 84 collectively mask portions of the fins 62 and/or the nanostructures 64, 66 during the etching processes used to form the source/drain recesses 92. A single etch process may be used to etch each of the nanostructures 64, 66, or multiple etch processes may be used to etch the nanostructures 64, 66. Timed etch processes may be used to stop the etching of the source/drain recesses 92 after the source/drain recesses 92 reach a desired depth. The fin spacers 90 (if present) may be etched during or after the etching of the source/drain recesses 92, so that the height of the fin spacers 90 is reduced. The dimensions of the source/drain regions that will be subsequently formed in the source/drain recesses 92 may be controlled by adjusting the height of the fin spacers 90.

Figure 9A:
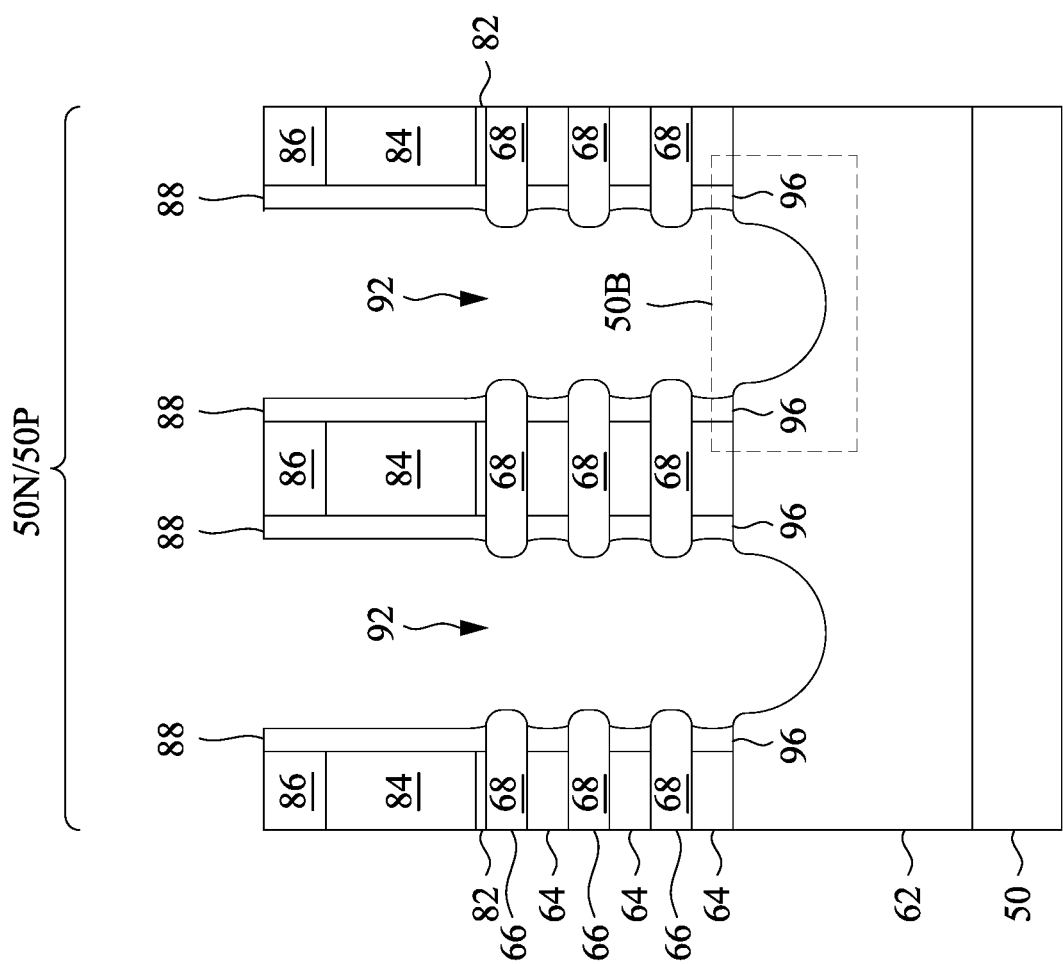
Figure 9C:
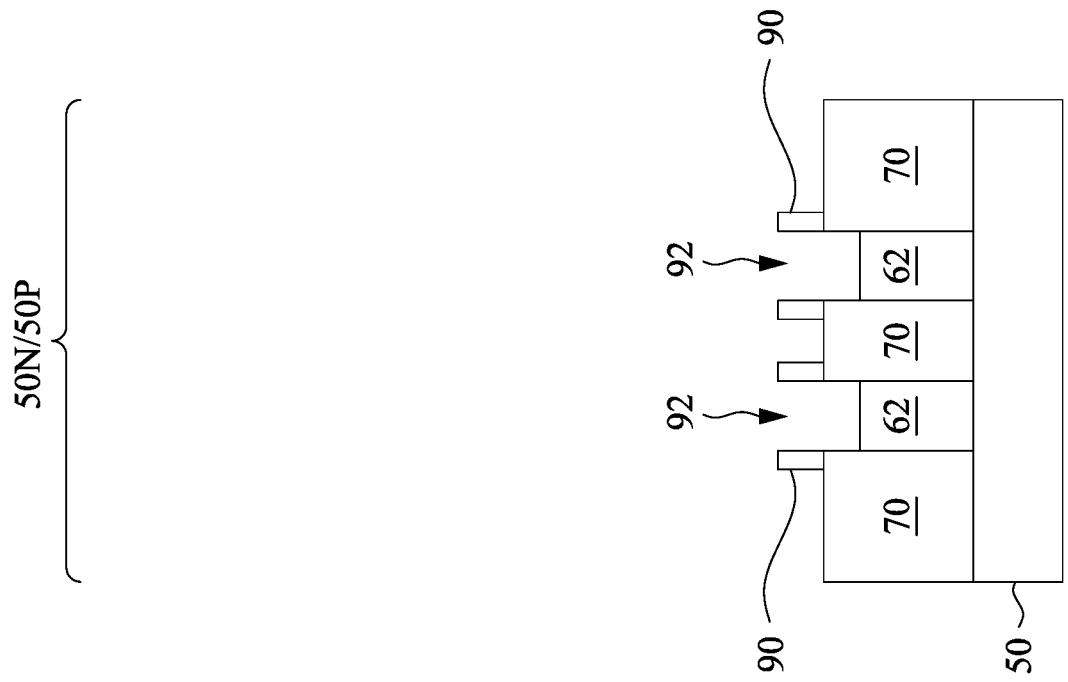
Figure 9B:
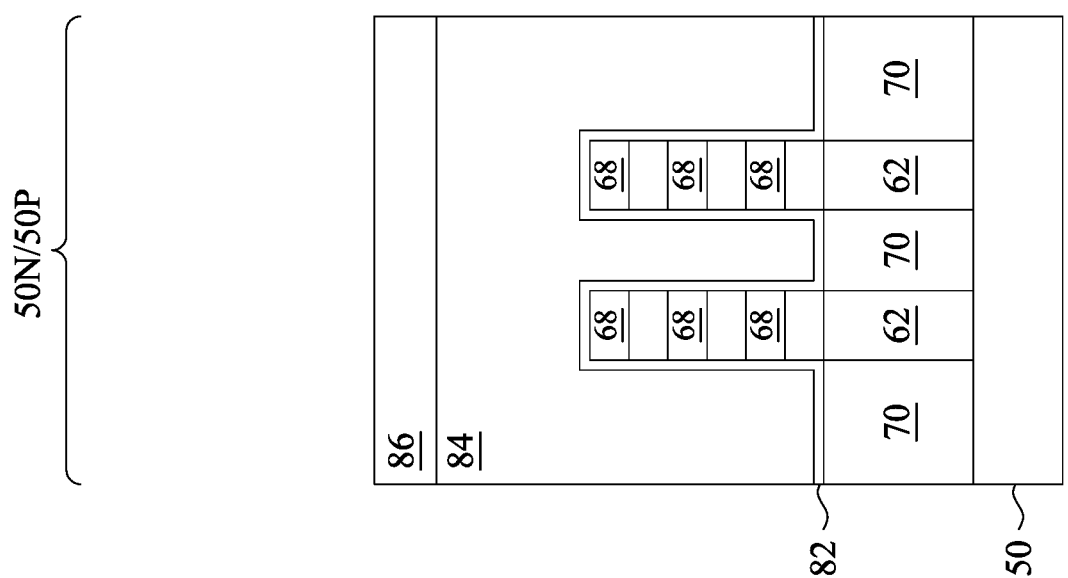

In FIGS. 9A-9C, inner spacers 96 are formed on the sidewalls of the remaining portions of the first nanostructures 64, e.g., those sidewalls exposed by the source/drain recesses 92. As will be subsequently described in greater detail, source/drain regions will be subsequently formed in the source/drain recesses 92, and the first nanostructures 64 will be subsequently replaced with corresponding gate structures. The inner spacers 96 act as isolation features between the subsequently formed source/drain regions and the subsequently formed gate structures. Further, the inner spacers 96 may be used to substantially prevent damage to the subsequently formed source/drain regions by subsequent etching processes, such as etching processes used to subsequently remove the first nanostructures 64.

As an example to form the inner spacers 96, the source/drain recesses 92 may be laterally expanded. Specifically, portions of the sidewalls of the first nanostructures 64 exposed by the source/drain recesses 92 may be recessed. Although sidewalls of the first nanostructures 64 are illustrated as being straight, the sidewalls may be concave or convex. The sidewalls may be recessed by any acceptable etching process, such as one that is selective to the material of the first nanostructures 64 (e.g., selectively etches the material of the first nanostructures 64 at a faster rate than the material of the second nanostructures 66). The etching may be isotropic. For example, when the second nanostructures 66 are formed of silicon and the first nanostructures 64 are formed of silicon germanium, the etching process may be a wet etch using tetramethylammonium hydroxide (TMAH), ammonium hydroxide (NH4OH), or the like. In another embodiment, the etching process may be a dry etch using a fluorine-based gas such as hydrogen fluoride (HF) gas. In some embodiments, the same etching process may be continually performed to both form the source/drain recesses 92 and recess the sidewalls of the first nanostructures 64. The inner spacers 96 can then be formed by conformally forming an insulating material and subsequently etching the insulating material. The insulating material may be silicon nitride, silicon carbonitride, or silicon oxycarbonitride, although any suitable material, such as low-k dielectric materials (e.g., dielectric materials having a k-value less than about 3.5), may be utilized. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 96 are illustrated as being flush with respect to the sidewalls of the gate spacers 88, the outer sidewalls of the inner spacers 96 may extend beyond or be recessed from the sidewalls of the gate spacers 88. In other words, the inner spacers 96 may partially fill, completely fill, or overfill the sidewall recesses. Moreover, although the outer sidewalls of the inner spacers 96 are illustrated as being concave, the outer sidewalls of the inner spacers 96 may be straight or convex.

In some embodiments, the widths of the gate spacers 88 are reduced, such as by the etching process(es) used to form the inner spacers 96. Further, the sidewalls of the second nanostructures 66 may be etched by the etching process(es) used to form the inner spacers 96. In some embodiments, the sidewalls of the second nanostructures 66 are rounded convex sidewalls at this stage of processing.

Figure 10B:
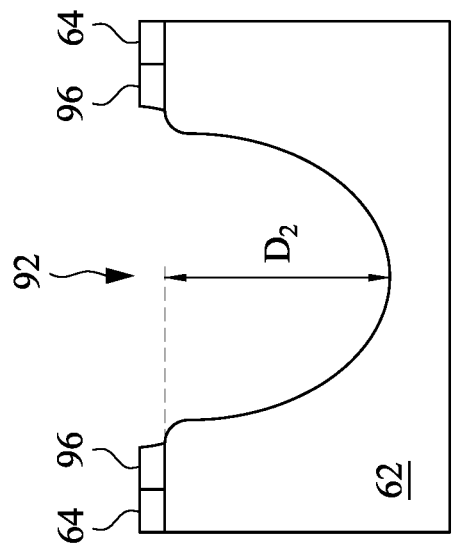
Figure 10A:
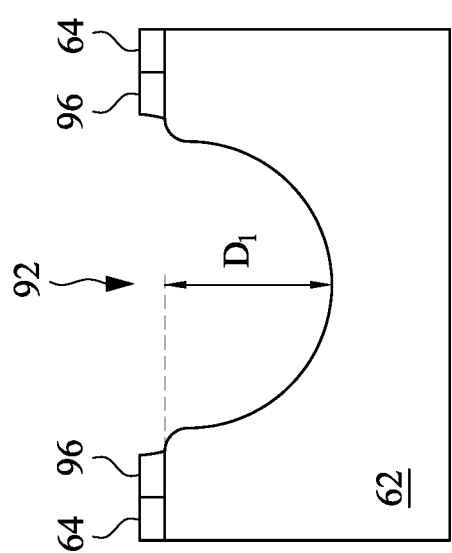
Figure 10C:
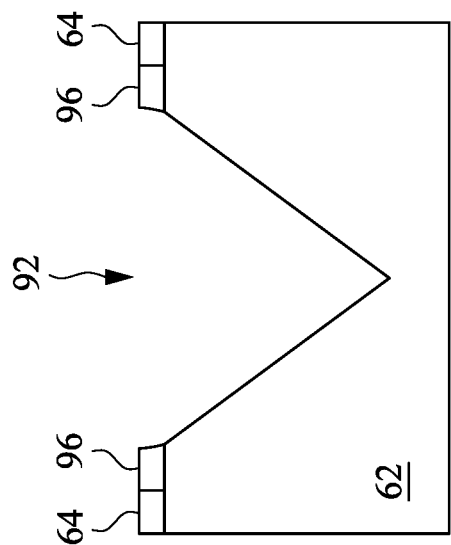

After the source/drain recesses 92 and the inner spacers 96 are formed, the source/drain recesses 92 which extend into the fins 62 can have a variety of bottom types. FIGS. 10A-10C illustrate different bottom types in a region 50B in FIG. 9A. The bottoms of the source/drain recesses 92 which extend into the fins 62 may be shallow rounded concave bottoms, as shown by FIG. 10A. The bottoms of the source/drain recesses 92 which extend into the fins 62 may be deep rounded concave bottoms, as shown by FIG. 10B. The deep rounded concave bottoms shown in FIG. 10B extend further into the fins 62 than the shallow rounded concave bottoms shown in FIG. 10A. In some embodiments, the shallow rounded concave bottoms have a depth $D_1$ in the range of 0 nm to 3 nm, and the deep rounded concave bottoms have a depth $D_2$ in the range of 3 nm to 5 nm. The bottoms of the source/drain recesses 92 which extend into the fins 62 may be polygonal concave bottoms, as shown by FIG. 10C.

Subsequent processing steps are shown for the embodiment of FIG. 10A, although those processing steps may be performed for any of the embodiments.

Figure 11A:
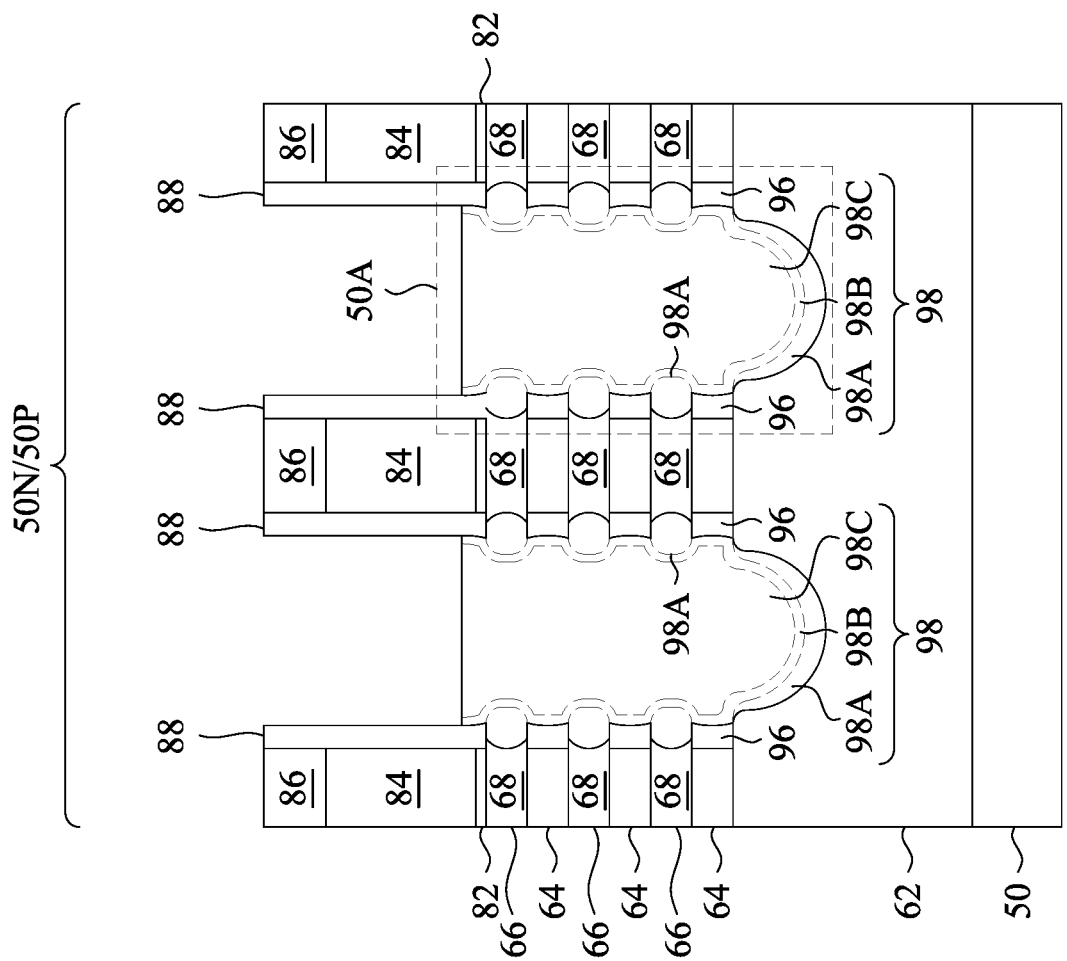
Figure 11C:
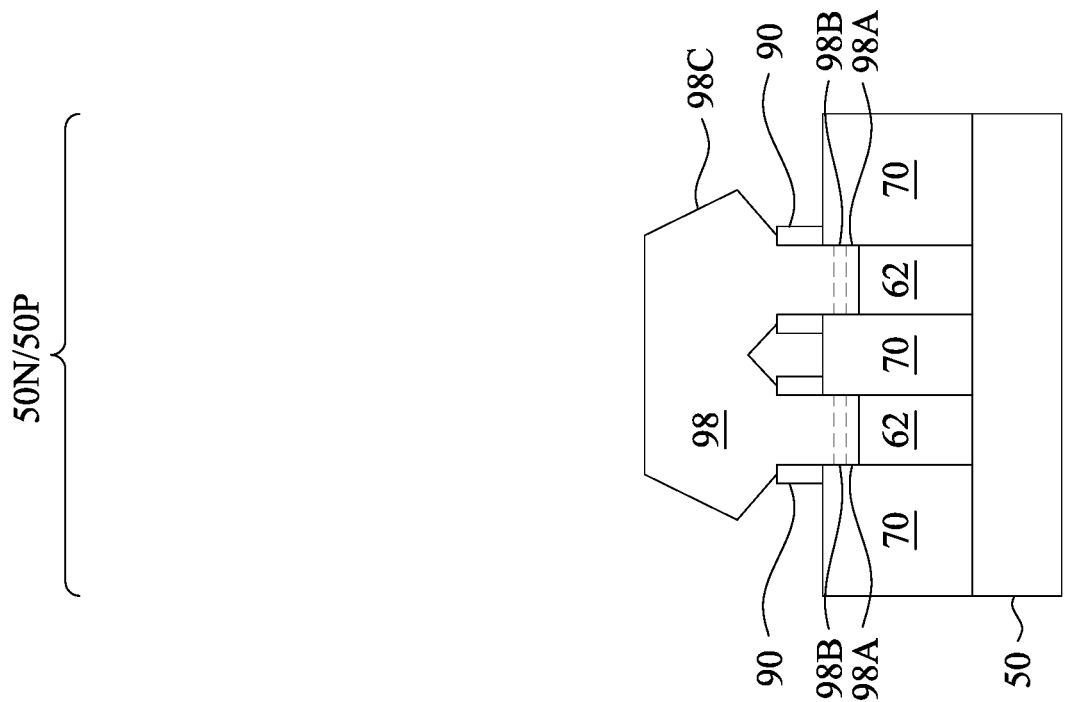
Figure 11B:
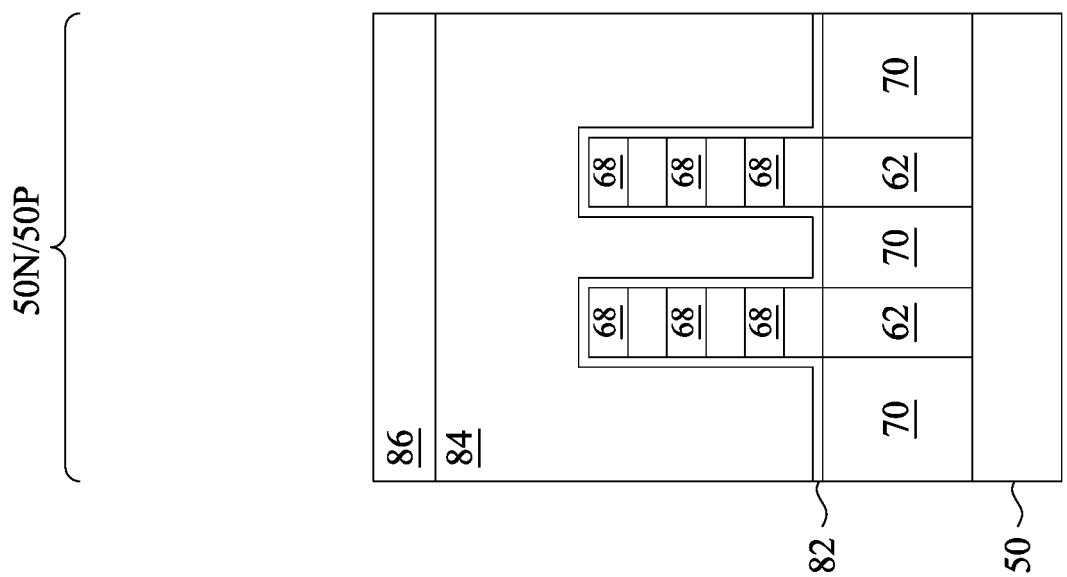

In FIGS. 11A-11C, epitaxial source/drain regions 98 are formed in the source/drain recesses 92. The epitaxial source/drain regions 98 are formed in the source/drain recesses 92 such that each dummy gate 84 (and corresponding channel region 68) is disposed between respective adjacent pairs of the epitaxial source/drain regions 98. In some embodiments, the gate spacers 88 and the inner spacers 96 are used to separate the epitaxial source/drain regions 98 from, respectively, the dummy gates 84 and the first nanostructures 64 by an appropriate lateral distance so that the epitaxial source/drain regions 98 do not short out with subsequently formed gates of the resulting nano-FETs. A material of the epitaxial source/drain regions 98 may be selected to exert stress in the respective channel regions 68, thereby improving performance.

The epitaxial source/drain regions 98 in the n-type region 50N may be formed by masking the p-type region 50P. Then, the epitaxial source/drain regions 98 in the n-type region 50N are epitaxially grown in the source/drain recesses 92 in the n-type region 50N. The epitaxial source/drain regions 98 may include any acceptable material appropriate for n-type devices. For example, if the second nanostructures 66 are silicon, the epitaxial source/drain regions 98 in the n-type region 50N may include materials exerting a tensile strain on the channel regions 68, such as silicon, silicon carbide, phosphorous-doped silicon carbide, silicon phosphide, or the like. The epitaxial source/drain regions 98 in the n-type region 50N may be referred to as "n-type source/drain regions." The epitaxial source/drain regions 98 in the n-type region 50N may have surfaces raised from respective surfaces of the fins 62 and the nanostructures 64, 66, and may have facets.

The epitaxial source/drain regions 98 in the p-type region 50P may be formed by masking the n-type region 50N. Then, the epitaxial source/drain regions 98 in the p-type region 50P are epitaxially grown in the source/drain recesses 92 in the p-type region 50P. The epitaxial source/drain regions 98 may include any acceptable material appropriate for p-type devices. For example, if the second nanostructures 66 are silicon, the epitaxial source/drain regions 98 in the p-type region 50P may include materials exerting a compressive strain on the channel regions 68, such as silicon germanium, boron-doped silicon germanium, germanium, germanium tin, or the like. The epitaxial source/drain regions 98 in the p-type region 50P may be referred to as "p-type source/drain regions." The epitaxial source/drain regions 98 in the p-type region 50P may have surfaces raised from respective surfaces of the fins 62 and the nanostructures 64, 66, and may have facets.

The epitaxial source/drain regions 98, the nanostructures 64, 66, and/or the fins 62 may be implanted with impurities to form source/drain regions, similar to the process previously described for forming LDD regions, followed by an anneal. The source/drain regions may have an impurity concentration in the range of $10^{19}$ cm$^{-3}$ to $10^{21}$ cm$^{-3}$. The n-type and/or p-type impurities for source/drain regions may be any of the impurities previously described. In some embodiments, the epitaxial source/drain regions 98 may be in situ doped during growth.

As a result of the epitaxy processes used to form the epitaxial source/drain regions 98, upper surfaces of the epitaxial source/drain regions 98 have facets which expand laterally outward beyond sidewalls of the fins 62 and the nanostructures 64, 66. In some embodiments, these facets cause adjacent epitaxial source/drain regions 98 to merge as illustrated by FIG. 11C. In some embodiments, adjacent epitaxial source/drain regions 98 remain separated after the epitaxy process is completed (not separately illustrated). In the illustrated embodiments, the spacer etch used to form the gate spacers 88 is adjusted to also form the fin spacers 90 on sidewalls of the fins 62 and/or the nanostructures 64, 66. The fin spacers 90 are formed to cover a portion of the sidewalls of the fins 62 and/or the nanostructures 64, 66 that extend above the STI regions 70, thereby blocking the epitaxial growth. In another embodiment, the spacer etch used to form the gate spacers 88 is adjusted to not form fin spacers, so as to allow the epitaxial source/drain regions 98 to extend to the surface of the STI regions 70.

The epitaxial source/drain regions 98 include multiple semiconductor material layers. Specifically, the epitaxial source/drain regions 98 each include seed layers 98A, a liner layer 98B, and a main layer 98C (or more generally, first, second, and third epitaxial layers). Other quantities of epitaxial layers may be used for the epitaxial source/drain regions 98. The seed layers 98A are grown on the surfaces of semiconductor features (e.g., surfaces of the fins 62 and the second nanostructures 66) exposed in the source/drain recesses 92. The liner layers 98B are grown on the seed layers 98A. The main layers 98C are grown on the liner layers 98B. Each of the seed layers 98A, the liner layers 98B, and the main layers 98C may be formed of different semiconductor materials and may be doped (e.g., with a p-type or an n-type impurity) to different impurity concentrations. In some embodiments, the liner layers 98B have a lesser impurity concentration than the main layers 98C. Forming the liner layers 98B with a lesser impurity concentration than the main layers 98C may increase adhesion in the source/drain recesses 92. In some embodiments, the layers 98A, 98B, 98C in the p-type region 50P each include the same p-type impurity (e.g., boron), and the layers 98A, 98B, 98C in the n-type region 50N each include the same n-type impurity (e.g., phosphorous).

In some embodiments, the liner layers 98B and the main layers 98C in the p-type region 50P are formed of boron-doped silicon germanium, which has a large bottom-up growth rate from silicon. As noted above, the second nanostructures 66 and the fins 62 may be formed of silicon. According to various embodiments, seed layers 98A are grown from the fins 62 and the second nanostructures 66, and the liner layers 98B are then grown from the seed layers 98A. The seed layers 98A include materials from which the materials of the liner layers 98B (e.g., boron-doped silicon germanium) have a low bottom-up growth rate. In some embodiments, the seed layers 98A in the p-type region 50P are formed of boron-doped silicon. By growing the liner layers 98B from the seed layers 98A instead of from the fins 62, the bottom-up growth rate of the liner layers 98B is reduced, and thus the thickness of the liner layers 98B at the bottom of the source/drain recesses 92 (e.g., the portion of the source/drain recesses 92 on the fins 62) may be decreased. As such, the volume available in the source/drain recesses 92 for the main layers 98C may be increased. The main layers 98C are highly-doped epitaxial layers that have a greater impurity concentration than the liner layers 98B, and increasing their volume helps decrease the resistance of the epitaxial source/drain regions 98, improving device performance. Further, the materials of the seed layers 98A may also help reduce out-diffusion of p-type dopants from the main layers 98C into the second nanostructures 66 or the fins 62 in subsequent processing, such as processing that includes a thermal drive-in step. Diffusion of dopants into the channel regions 68 may thus be reduced, decreasing the resistance of the channel regions 68 and improving device performance.

The semiconductor material of the seed layers 98A in the p-type region 50P is different from the semiconductor material(s) of the liner layers 98B and the main layers 98C in the p-type region 50P. The liner layers 98B and the main layers 98C may be formed of the same semiconductor material, or may be formed of different semiconductor materials. In some embodiments, the seed layers 98A are formed of a doped germanium-free semiconductor material (e.g., boron-doped silicon), and the liner layers 98B and the main layers 98C are formed of a doped germanium-containing semiconductor material (e.g., boron-doped silicon germanium). A germanium concentration of the seed layers 98A (e.g., zero) is less than a germanium concentration of the liner layers 98B and the main layers 98C (e.g., non-zero).

FIGS. 12-16 illustrate a process for forming epitaxial source/drain regions 98 in the p-type region 50P. FIGS. 12-16 illustrate features in a region 50A in FIG. 11A. As previously described, the seed layers 98A include materials from which the materials of the liner layers 98B have a low bottom-up growth rate, and which also help reduce out-diffusion of p-type dopants into the second nanostructures 66 or the fins 62 in subsequent processing.

Figure 12:
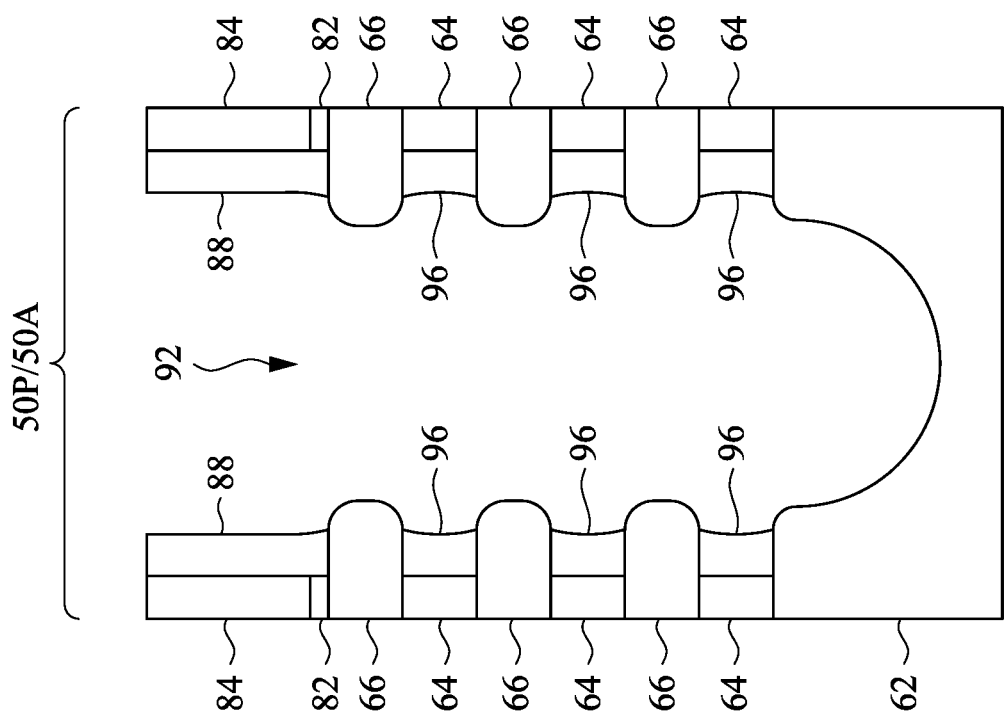

In FIG. 12, the source/drain recesses 92 and the inner spacers 96 are formed, as described for FIGS. 8A-9C. In this embodiment, the inner spacers 96 are recessed from the sidewalls of the second nanostructures 66 after formation. In other embodiments, the inner spacers 96 extend beyond or are flush with the sidewalls of the second nanostructures 66 after formation.

Figure 13:
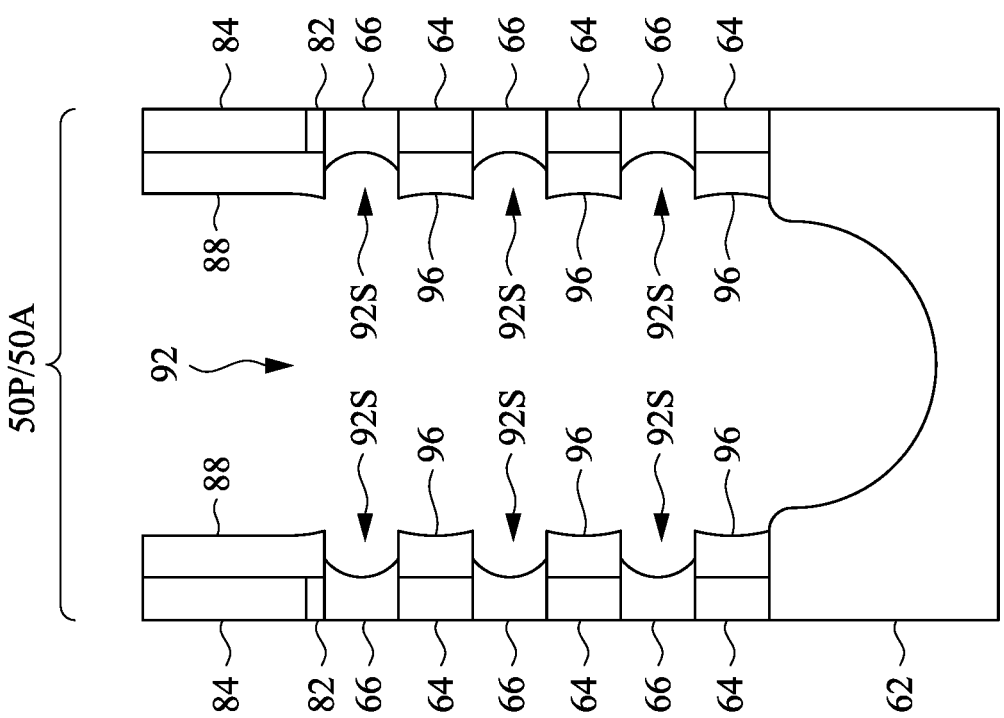

In FIG. 13, sidewall recesses 92S are formed by recessing the portions of the sidewalls of the second nanostructures 66 which are exposed by the source/drain recesses 92. After the sidewalls of the second nanostructures 66 are recessed, the second nanostructures 66 can have a variety of sidewall types. In this embodiment, the second nanostructures 66 have concave sidewalls. In other embodiments (subsequently described for FIGS. 23-24), the second nanostructures 66 have straight sidewalls or convex sidewalls. The sidewalls of the second nanostructures 66 may be recessed by any acceptable etching process, such as one that is selective to the material of the second nanostructures 66 (e.g., selectively etches the material of the second nanostructures 66 at a faster rate than the material of the inner spacers 96). The etching may be isotropic. For example, when the second nanostructures 66 are formed of silicon and the inner spacers 96 are formed of silicon nitride, the etching process may be a wet etch using potassium hydroxide (KOH), tetramethylammonium hydroxide (TMAH), ethylenediamine pyrocatechol (EDP), or the like. Timed etch processes may be used to stop the etching of the second nanostructures 66 after the sidewalls of the second nanostructures 66 are recessed by a desired amount. Specifically, the sidewalls of the second nanostructures 66 are etched until they are recessed from the outer sidewalls of the inner spacers 96. As such, the outer sidewalls of the inner spacers 96 are disposed further from the first nanostructures 64 (and thus the subsequently formed replacement gate structures) than the sidewalls of the second nanostructures 66. In some embodiments, the second nanostructures 66 are etched for a duration in the range of 15 seconds to 60 seconds.

Figure 14:
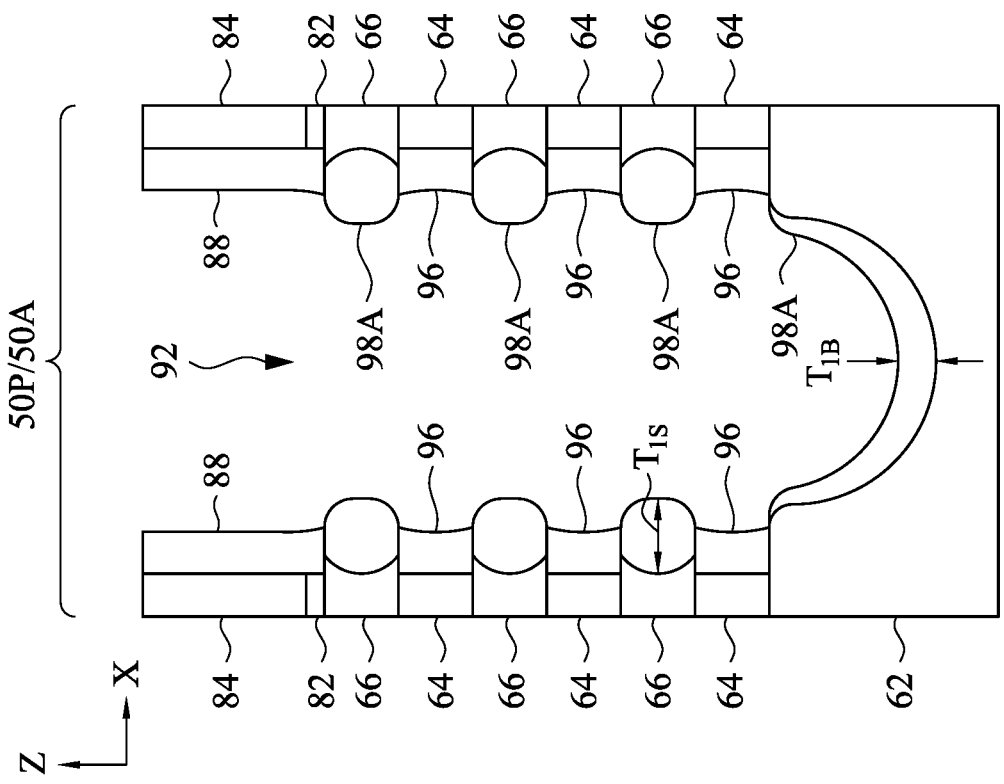

In FIG. 14, the seed layers 98A in the p-type region 50P are epitaxially grown on the surfaces of semiconductor features (e.g., surfaces of the fins 62 and the second nanostructures 66) exposed in the source/drain recesses 92. Specifically, the seed layers 98A are grown in the sidewall recesses 92S and on the fins 62. The seed layers 98A are grown so that they remain separated and do not merge in the source/drain recesses 92. Specifically growth of the seed layers 98A is stopped before they merge in the source/drain recess 92. The outer sidewalls of the inner spacers 96 are thus at least partially uncovered (e.g., not contacted) by the seed layers 98A, and remain exposed after growth of the seed layers 98A. In other words, the outer sidewalls of the inner spacers 96 are free of the seed layers 98A. After growth, the outer sidewalls of the seed layers 98A extend beyond the outer sidewalls of the inner spacers 96. As such, the outer sidewalls of the seed layers 98A are disposed further from the first nanostructures 64 (and thus the subsequently formed replacement gate structures) than the outer sidewalls of the inner spacers 96 and the sidewalls of the second nanostructures 66.

The epitaxial growth process used to form the seed layers 98A has a first bottom-up growth rate (e.g., in the Z-direction), and has a first lateral growth rate (e.g., in the X-direction), with the ratio of the first bottom-up growth rate to the first lateral growth rate being small, such as less than 2. As such, the thickness $T_{1B}$ of the seed layers 98A at the bottom of the source/drain recesses 92 differs from the thickness $T_{1S}$ of the seed layers 98A at the sidewalls of the source/drain recesses 92 (e.g., in the sidewall recesses 92S) by a small amount. Specifically, although the thickness $T_{1B}$ is greater than the thickness $T_{1S}$, the ratio of the thickness $T_{1B}$ to the thickness $T_{1S}$ is less than 2. In other words, the ratio of the thickness $T_{1B}$ to the thickness $T_{1S}$ is in the range of 1 to 3. In some embodiments, the thickness $T_{1B}$ is in the range of 4 nm to 8 nm, the thickness $T_{1S}$ is in the range of 2 nm to 4 nm, and the thickness $T_{1B}$ is greater than the thickness $T_{1S}$. Forming the seed layers 98A with a thickness $T_{1S}$ that is less than 2 nm may not sufficiently reduce out-diffusion of p-type dopants to the channel regions 68, decreasing device performance. Forming the seed layers 98A with a thickness $T_{1B}$ that is greater than 8 nm may not leave enough volume available in the source/drain recesses 92 for highly-doped epitaxial layers, decreasing device performance.

The seed layers 98A may be grown from the second nanostructures 66 and the fins 62 by exposing the second nanostructures 66 and the fins 62 to one or more semiconductor-containing precursor(s), a dopant-containing precursor, and an etching precursor. When the seed layers 98A in the p-type region 50P are formed of boron-doped silicon, the semiconductor-containing precursor(s) may be silicon-containing precursor(s), the dopant-containing precursor may be a boron-containing precursor, and the etching precursor may be a chlorine-containing precursor. The silicon-containing precursor may be a silane such as dichlorosilane ($H_2SiCl_2$), monosilane ($SiH_4$), or the like. The boron-containing precursor may be diborane ($B_2H_6$) or the like. The chlorine-containing precursor may be hydrochloric (HCl) acid or the like. In some embodiments, the second nanostructures 66 and the fins 62 are exposed to the semiconductor-containing precursor(s), the dopant-containing precursor, and the etching precursor at a temperature in the range of 600° C. to 700° C., at a pressure in the range of 20 Torr to 50 Torr, and for a duration in the range of 2 minutes to 5 minutes. Growing the seed layers 98A at a temperature and at a pressure in these ranges allows the seed layers 98A to have a desired thickness (previously described). Growing the seed layers 98A at a temperature or at a pressure outside of these ranges may not allow the seed layers 98A to have the desired thickness.

The concentration of impurities in the seed layers 98A determines how well the seed layers 98A reduce out-diffusion of p-type dopants to the channel regions 68. In some embodiments, the seed layers 98A include Si:B, and have a boron concentration in the range of $1 \times 10^{19}$ cm$^{-3}$ to $2 \times 10^{21}$ cm$^{-3}$. Forming the seed layers 98A with a boron concentration of less than $1 \times 10^{19}$ cm$^{-3}$ may not sufficiently reduce out-diffusion of p-type dopants to the channel regions 68, decreasing device performance. Forming the seed layers 98A with a boron concentration of greater than $2 \times 10^{21}$ cm$^{-3}$ may result in a low quality of epitaxial growth, causing the resistance of the epitaxial source/drain regions 98 to be high and decreasing device performance.

Figure 15:
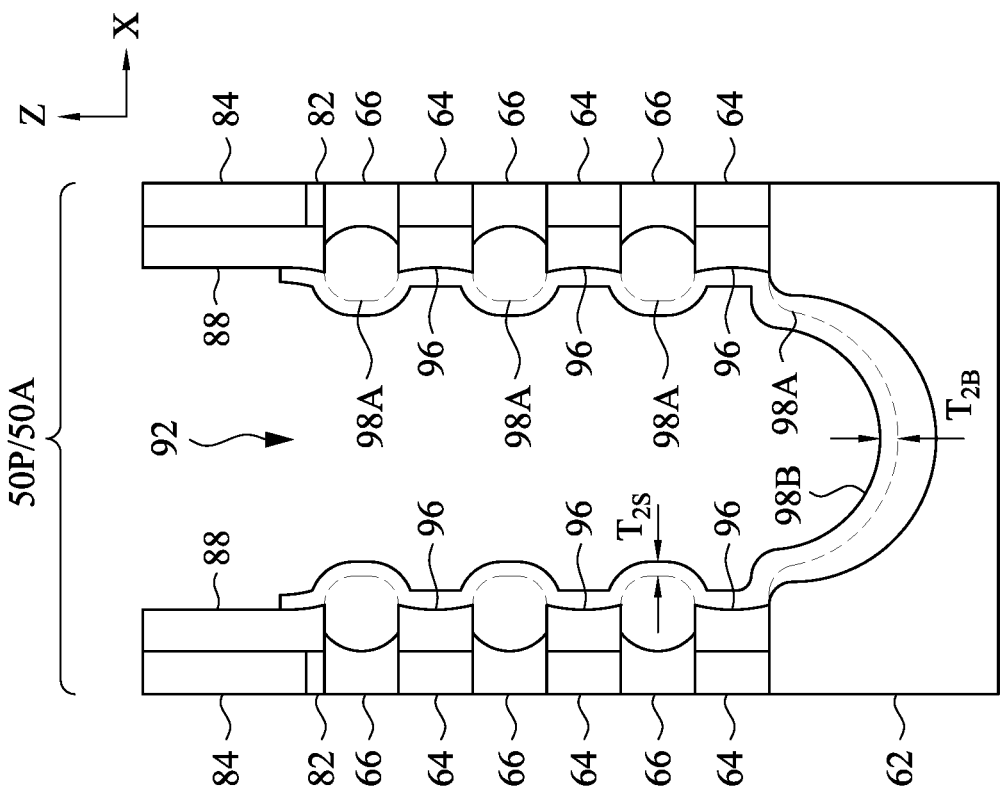

In FIG. 15, the liner layers 98B in the p-type region 50P are epitaxially grown on the surfaces of the seed layers 98A. The liner layers 98B are grown until they merge in each source/drain recess 92. The outer sidewalls of the inner spacers 96 are thus covered (e.g., contacted) by the liner layers 98B.

The epitaxial growth process used to form the liner layers 98B has a second bottom-up growth rate (e.g., in the Z-direction), and has a second lateral growth rate (e.g., in the X-direction), with the ratio of the second bottom-up growth rate to the second lateral growth rate being small, such as less than 4. As noted above, the liner layers 98B are grown from the seed layers 98A instead of from the fins 62. The second bottom-up growth rate is smaller when performed from the seed layers 98A than it would be if growth were performed from the fins 62. Further, the first bottom-up growth rate (described for FIG. 14) is less than what the second bottom-up growth rate would be if growth were performed from the fins 62. As such, the thickness $T_{2B}$ of the liner layers 98B at the bottom of the source/drain recesses 92 differs from the thickness $T_{2S}$ of the liner layers 98B at the sidewalls of the source/drain recesses 92 by a small amount. In some embodiments, the thickness $T_{2B}$ is in the range of 8 nm to 16 nm, the thickness $T_{2S}$ is in the range of 2 nm to 4 nm, and the thickness $T_{2B}$ is greater than the thickness $T_{2S}$. Forming the liner layers 98B with a thickness $T_{2S}$ that is less than 2 nm may not provide sufficient adhesion for the growth of subsequent epitaxial layers, decreasing device reliability. Forming the liner layers 98B with a thickness $T_{2B}$ than is greater than 16 nm may not leave enough volume available in the source/drain recesses 92 for highly-doped epitaxial layers, decreasing device performance.

The liner layers 98B may be grown from the seed layers 98A by exposing the seed layers 98A to multiple semiconductor-containing precursors, a dopant-containing precursor, and an etching precursor. When the liner layers 98B in the p-type region 50P are formed of boron-doped silicon germanium, the semiconductor-containing precursors may include a silicon-containing precursor and a germanium-containing precursor; the dopant-containing precursor may be a boron-containing precursor; and the etching precursor may be a chlorine-containing precursor. The silicon-containing precursor may be a silane such as dichlorosilane ($H_2SiCl_2$), monosilane ($SiH_4$), or the like. The germanium-containing precursor may be a germane such as monogermane ($GeH_4$) or the like. The boron-containing precursor may be diborane ($B_2H_6$) or the like. The chlorine-containing precursor may be hydrochloric (HCl) acid or the like. In some embodiments, the seed layers 98A are exposed to the semiconductor-containing precursors, the dopant-containing precursor, and the etching precursor at a temperature in the range of 580° C. to 680° C., at a pressure in the range of 20 Torr to 50 Torr, and for a duration in the range of 2 minutes to 4 minutes. The dopant-containing precursor and/or the etching precursor used to grow the liner layers 98B may be the same as those used to grow the seed layers 98A, or may include different precursors. Growing the liner layers 98B at a temperature and at a pressure in these ranges allows the liner layers 98B to have a desired thickness (previously described). Growing the liner layers 98B at a temperature or at a pressure outside of these ranges may not allow the liner layers 98B to have the desired thickness.

Figure 16:
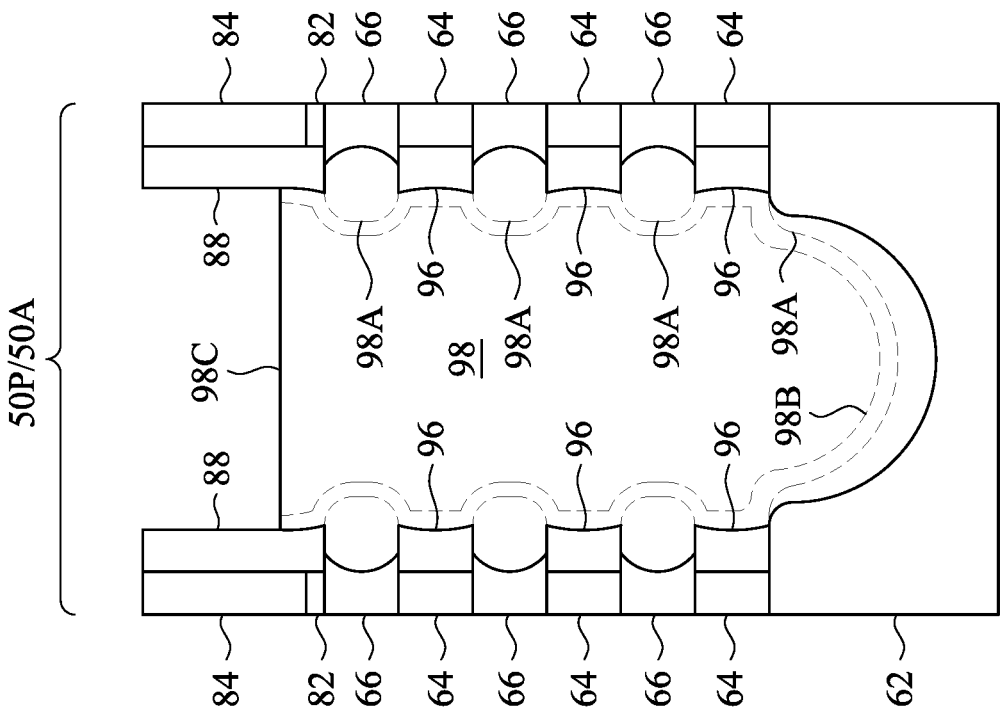

In FIG. 16, the main layers 98C in the p-type region 50P are epitaxially grown on the surfaces of the liner layers 98B. The main layers 98C are grown until they fill (or overfill) each source/drain recess 92. Because the thickness of the liner layers 98B at the bottom of the source/drain recesses 92 is reduced, the main layers 98C may occupy an increased volume of the source/drain recesses 92.

The main layers 98C may be grown from the liner layers 98B by exposing the liner layers 98B to multiple semiconductor-containing precursors, a dopant-containing precursor, and an etching precursor. When the main layers 98C in the p-type region 50P are formed of boron-doped silicon germanium, the semiconductor-containing precursors may include a silicon-containing precursor and a germanium-containing precursor; the dopant-containing precursor may be a boron-containing precursor; and the etching precursor may be a chlorine-containing precursor. The silicon-containing precursor may be a silane such as dichlorosilane ($H_2SiCl_2$), monosilane ($SiH_4$), or the like. The germanium-containing precursor may be a germane such as monogermane ($GeH_4$) or the like. The boron-containing precursor may be diborane ($B_2H_6$) or the like. The chlorine-containing precursor may be hydrochloric (HCl) acid or the like. In some embodiments, the liner layers 98B are exposed to the semiconductor-containing precursors, the dopant-containing precursor, and the etching precursor at a temperature in the range of 550° C. to 650° C., at a pressure in the range of 20 Torr to 50 Torr, and for a duration in the range of 3 minutes to 7 minutes. The semiconductor-containing precursors, the dopant-containing precursor, and/or the etching precursor used to grow the main layers 98C may be the same as those used to grow the liner layers 98B and/or the seed layers 98A, or may include different precursors.

The main layers 98C are highly-doped epitaxial layers and the liner layers 98B are lightly-doped epitaxial layers. Specifically, the main layers 98C may have a greater germanium concentration and a greater boron concentration than the liner layers 98B. In some embodiments, the liner layers 98B are formed of $Si_{1-x}Ge_x$:B having a boron concentration in the range of $1 \times 10^{20}$ cm$^{-3}$ to $5 \times 10^{20}$ cm$^{-3}$, and the main layers 98C are formed of $Si_{1-y}Ge_y$:B having a boron concentration in the range of $4 \times 10^{20}$ cm$^{-3}$ to $10 \times 10^{20}$ cm$^{-3}$, where x is in the range of 0.1 to 0.4 and y is in the range of 0.2 to 0.9 (or more generally, x is less than y). In some embodiments, the seed layers 98A also have a greater boron concentration than the liner layers 98B.

Figure 17A:
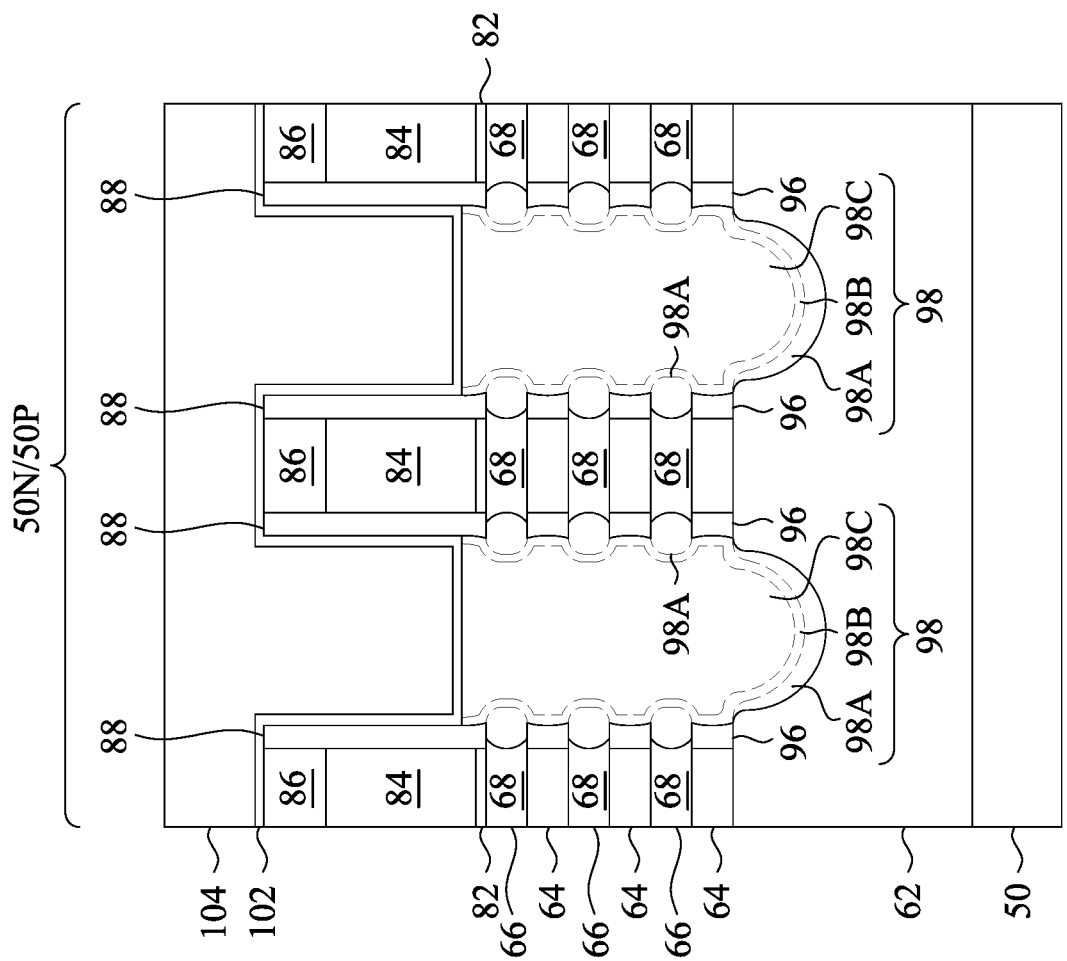
Figure 17C:
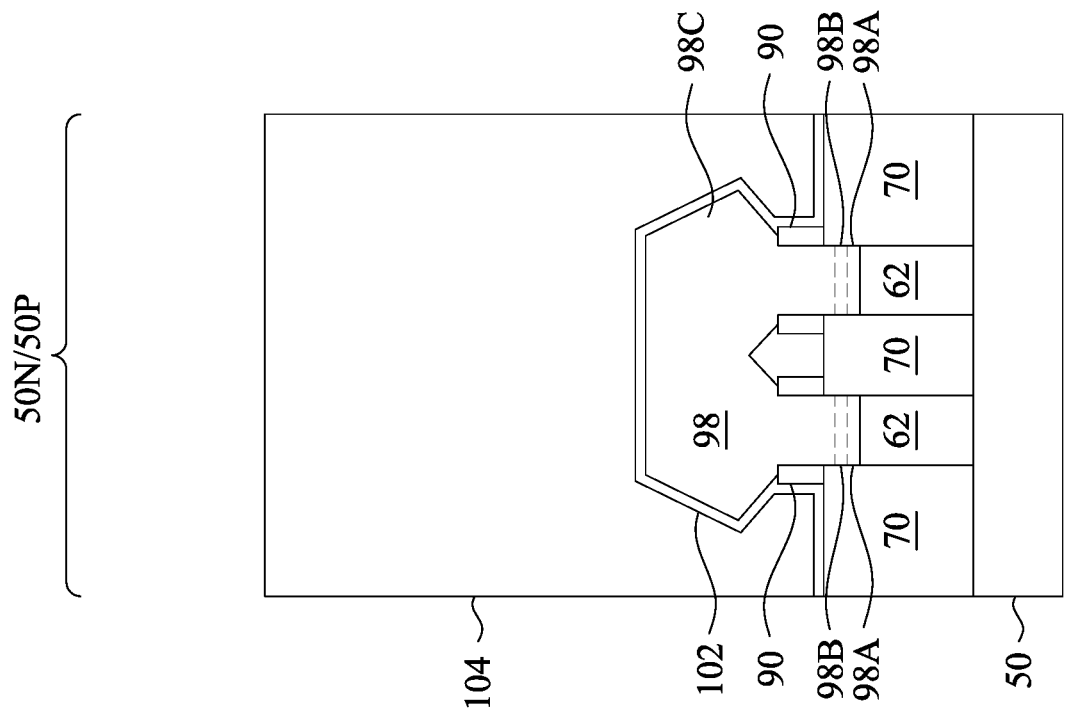
Figure 17B:
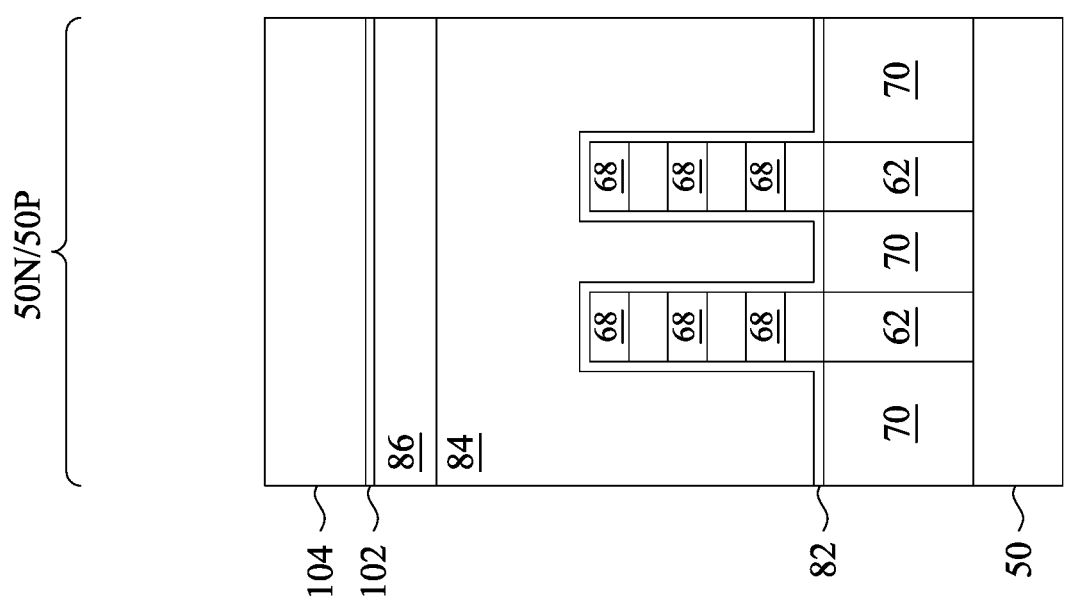

In FIGS. 17A-17C, a first ILD 104 is deposited over the epitaxial source/drain regions 98, the gate spacers 88, and the masks 86 (if present) or the dummy gates 84. The first ILD 104 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 102 is formed between the first ILD 104 and the epitaxial source/drain regions 98, the gate spacers 88, and the masks 86 (if present) or the dummy gates 84. The CESL 102 may be formed of a dielectric material, such as silicon nitride, silicon oxide, silicon oxynitride, or the like, having a high etching selectivity from the etching of the first ILD 104. The CESL 102 may be formed by an any suitable method, such as CVD, ALD, or the like.

Figure 18A:
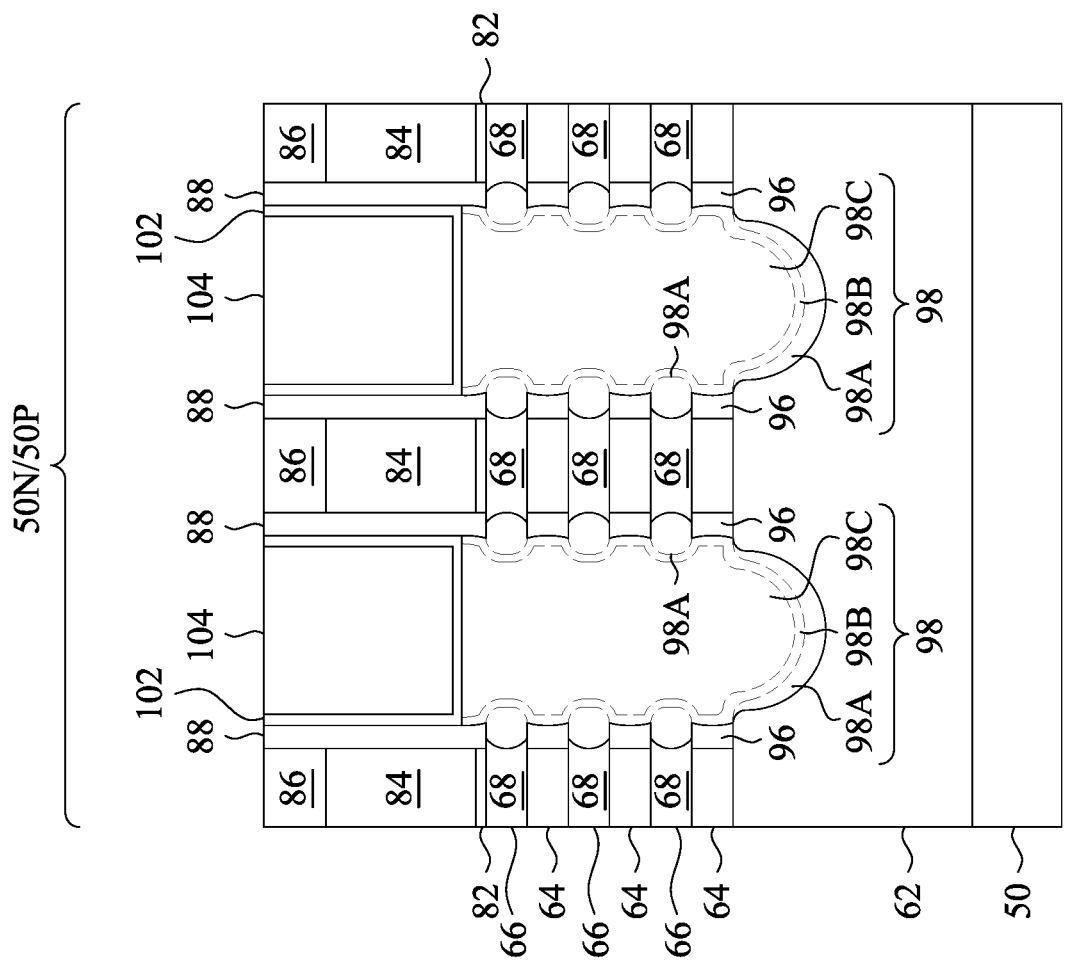
Figure 18C:
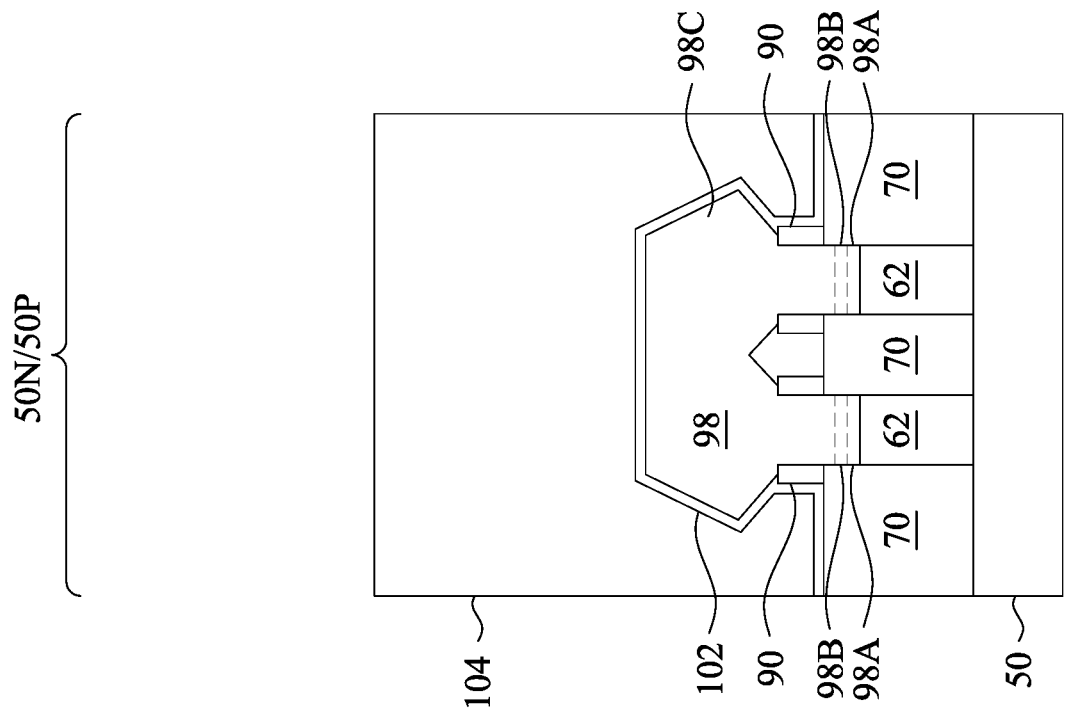
Figure 18B:
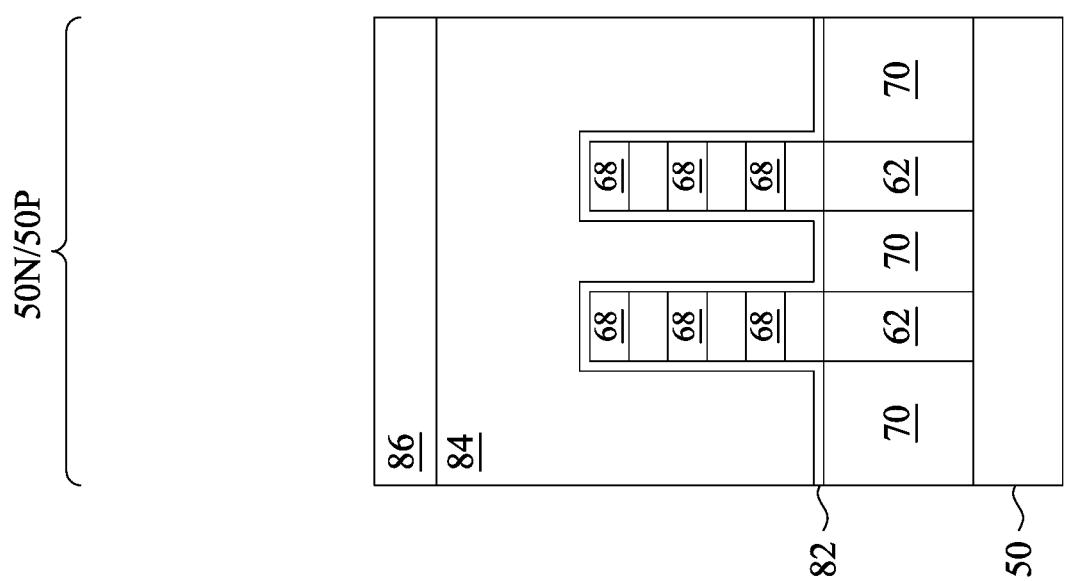

In FIGS. 18A-18C, a removal process is performed to level the top surfaces of the first ILD 104 with the top surfaces of the gate spacers 88 and the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 88 along sidewalls of the masks 86. After the planarization process, the top surfaces of the gate spacers 88, the first ILD 104, the CESL 102, and the masks 86 (if present) or the dummy gates 84 are coplanar (within process variations). Accordingly, the top surfaces of the masks 86 (if present) or the dummy gates 84 are exposed through the first ILD 104. In the illustrated embodiment, the masks 86 remain, and the planarization process levels the top surfaces of the first ILD 104 with the top surfaces of the masks 86.

Figure 19A:
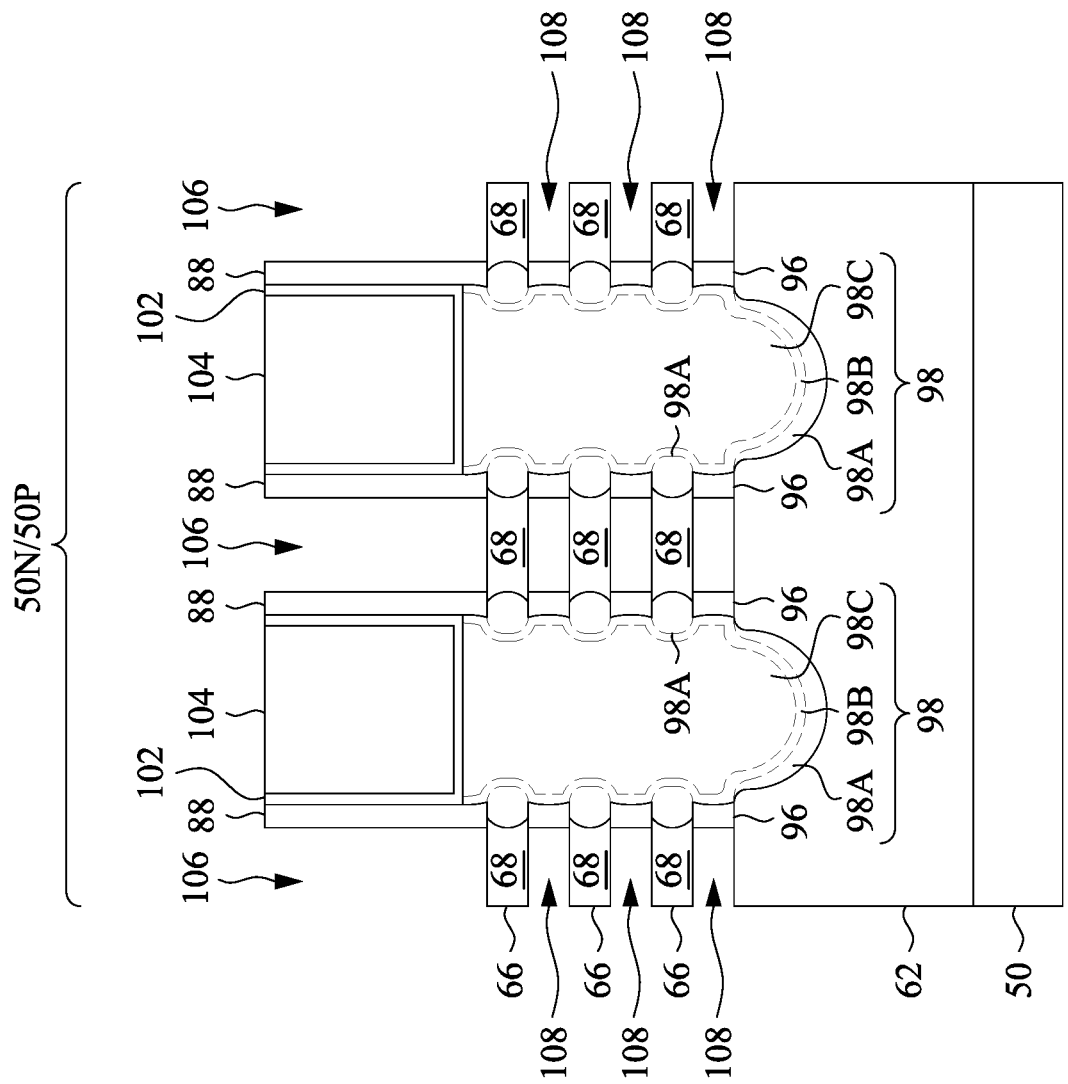

In FIGS. 19A-19C, the masks 86 (if present) and the dummy gates 84 are removed in an etching process, so that recesses 106 are formed. Portions of the dummy dielectrics 82 in the recesses 106 are also removed. In some embodiments, the dummy gates 84 are removed by an anisotropic dry etch process. For example, the etching process may include a dry etch process using reaction gas(es) that selectively etch the dummy gates 84 at a faster rate than the first ILD 104 or the gate spacers 88. During the removal, the dummy dielectrics 82 may be used as etch stop layers when the dummy gates 84 are etched. The dummy dielectrics 82 are then removed. Each recess 106 exposes and/or overlies portions of the channel regions 68. Portions of the second nanostructures 66 which act as the channel regions 68 are disposed between and adjoin adjacent pairs of the epitaxial source/drain regions 98.

The remaining portions of the first nanostructures 64 are then removed to expand the recesses 106, such that openings 108 are formed between the second nanostructures 66. The remaining portions of the first nanostructures 64 can be removed by any acceptable etching process that selectively etches the material of the first nanostructures 64 at a faster rate than the material of the second nanostructures 66. The etching may be isotropic. For example, when the first nanostructures 64 are formed of silicon germanium and the second nanostructures 66 are formed of silicon, the etching process may be a wet etch using tetramethylammonium hydroxide (TMAH), ammonium hydroxide ($NH_4OH$), or the like. In some embodiments, a trim process (not separately illustrated) is performed to decrease the thicknesses of the exposed portions of the second nanostructures 66.

Figure 20A:
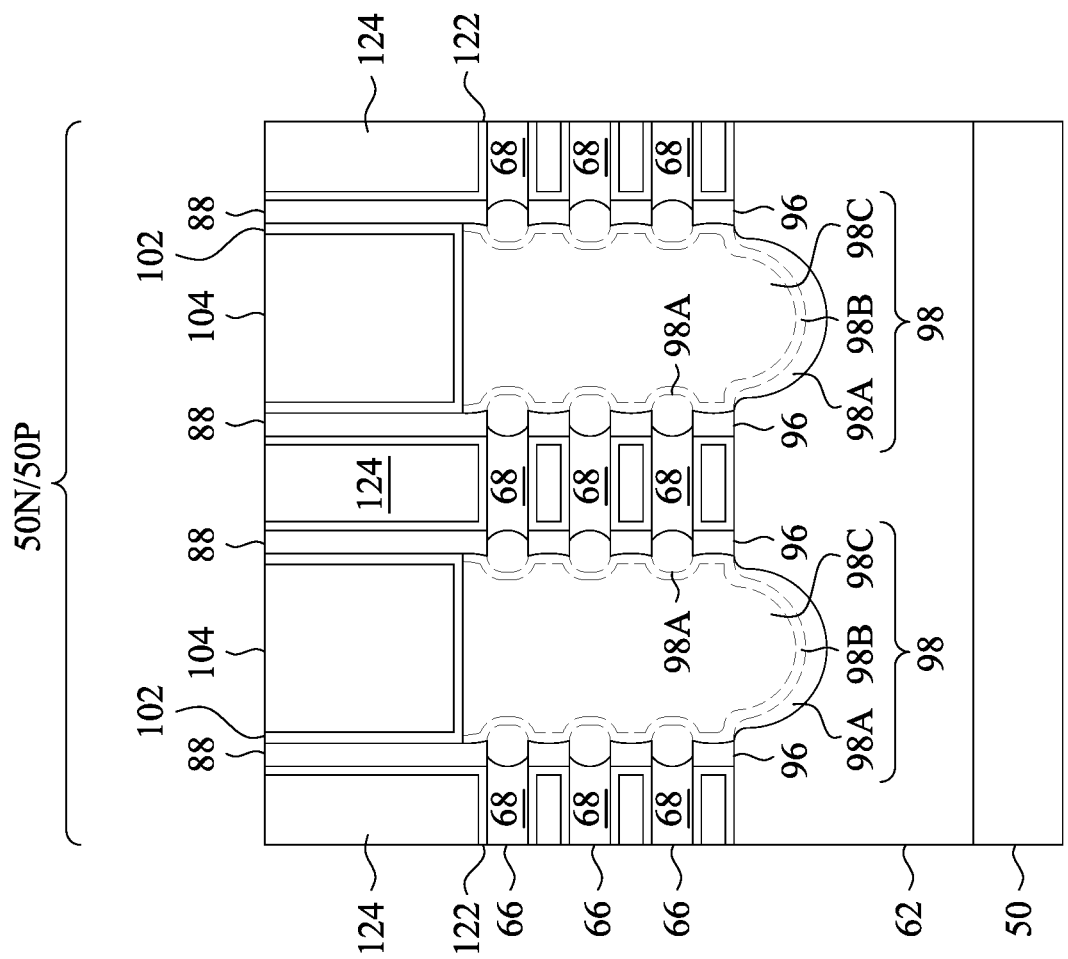
Figure 20C:
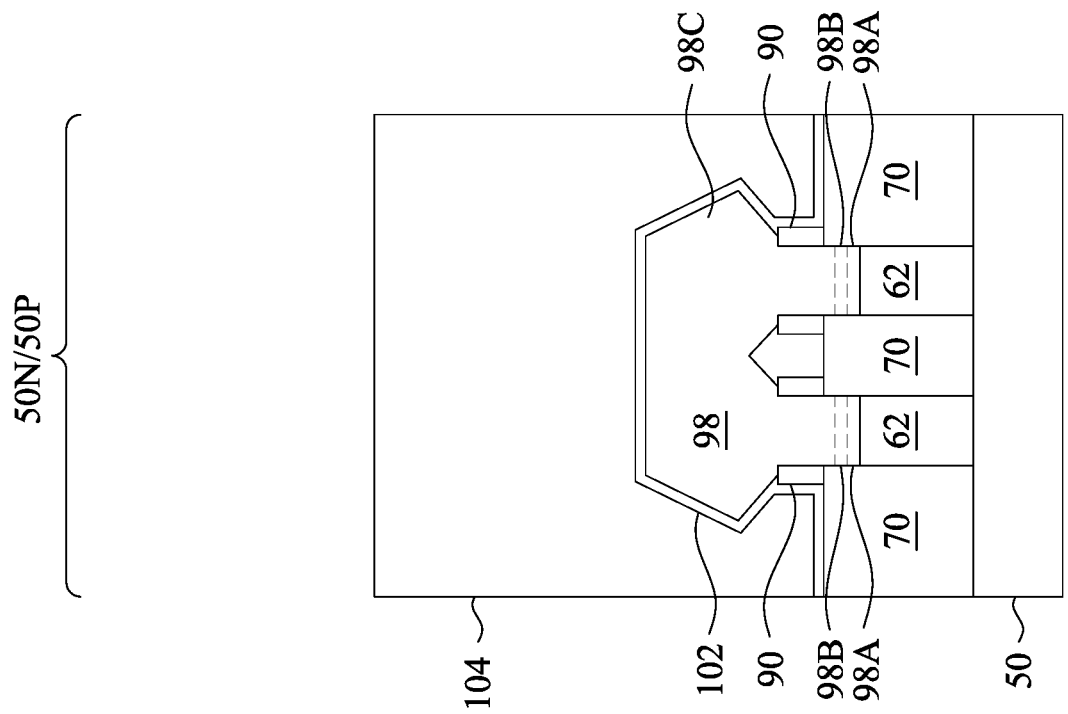
Figure 20B:
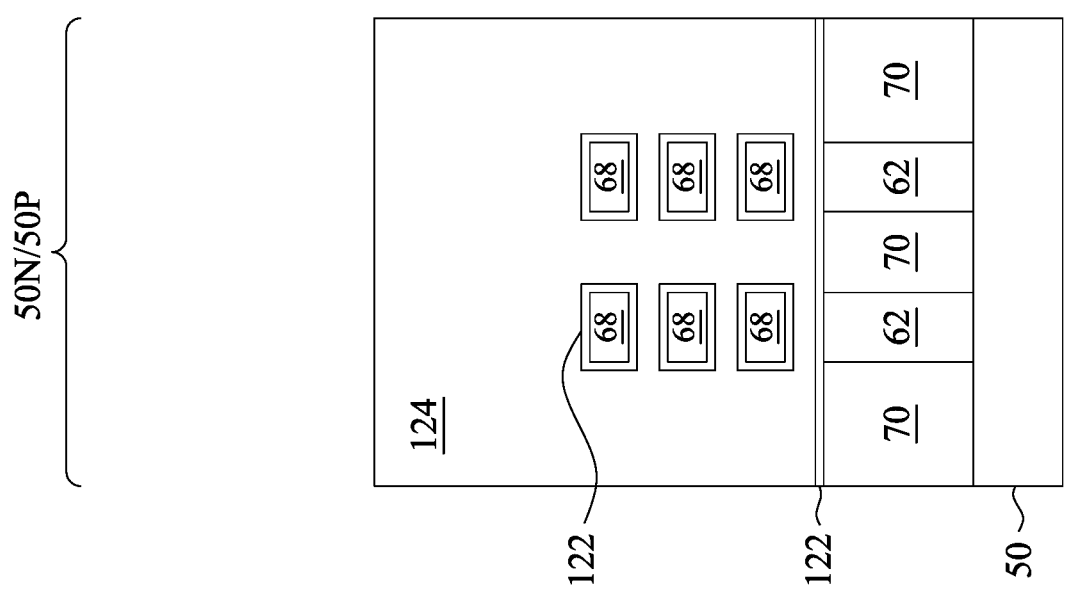

In FIGS. 20A-20C, gate dielectrics 122 and gate electrodes 124 are formed for replacement gate structures. Each respective pair of a gate dielectric 122 and a gate electrode 124 may be collectively referred to as a "gate structure." Each gate structure extends along sidewalls and a top surface of a channel region 68 of a nanostructure 66. Some of the gate structures also extend along sidewalls and/or a top surface of a fin 62. The gate dielectrics 122 include one or more gate dielectric layer(s) disposed around the nanostructure 66 and on the sidewalls of the gate spacers 88 and the inner spacers 96. The gate dielectrics 122 may be formed of an oxide such as silicon oxide or a metal oxide, a silicate such as a metal silicate, combinations thereof, multi-layers thereof, or the like. Additionally or alternatively, the gate dielectrics 122 may be formed of a high-k dielectric material (e.g., dielectric materials having a k-value greater than about 7.0), such as a metal oxide or a silicate of hafnium, aluminum, zirconium, lanthanum, manganese, barium, titanium, lead, and combinations thereof. The dielectric material(s) of the gate dielectrics 122 may be formed by molecular-beam deposition (MBD), ALD, PECVD, or the like. Although a single-layered gate dielectrics 122 are illustrated, the gate dielectrics 122 may include any number of interfacial layers and any number of main layers. For example, the gate dielectrics 122 may include an interfacial layer and an overlying high-k dielectric layer.

The gate electrodes 124 include one or more gate electrode layer(s) disposed over the gate dielectrics 122. The gate electrodes 124 may be formed of a metal-containing material such as titanium nitride, titanium oxide, tantalum nitride, tantalum carbide, tungsten, cobalt, ruthenium, aluminum, combinations thereof, multi-layers thereof, or the like. Although single-layered gate electrodes 124 are illustrated, the gate electrodes 124 may include any number of work function tuning layers, any number of barrier layers, any number of glue layers, and a fill material.

As an example to form the gate structures, one or more gate dielectric layer(s) may be deposited in the recesses 106 and the openings 108. The gate dielectric layer(s) may also be deposited on the top surfaces of the first ILD 104, the CESL 102, and the gate spacers 88. Subsequently, one or more gate electrode layer(s) may be deposited on the gate dielectric layer(s), and in the remaining portions of the recesses 106 and the openings 108. A removal process may then be performed to remove the excess portions of the gate dielectric layer(s) and the gate electrode layer(s), which excess portions are over the top surfaces of the first ILD 104, the CESL 102, and the gate spacers 88. The gate dielectric layer(s), after the removal process, have portions left in the recesses 106 and the openings 108 (thus forming the gate dielectrics 122). The gate electrode layer(s), after the removal process, have portions left in the recesses 106 and the openings 108 (thus forming the gate electrodes 124). In some embodiments, a planarization process such as a chemical mechanical polish (CMP), an etch-back process, combinations thereof, or the like may be utilized. After the planarization process, the top surfaces of the gate spacers 88, the CESL 102, the first ILD 104, the gate dielectrics 122, and the gate electrodes 124 are coplanar (within process variations).

The formation of the gate dielectrics 122 in the n-type region 50N and the p-type region 50P may occur simultaneously such that the gate dielectrics 122 in each region are formed of the same material(s), and the formation of the gate electrodes 124 may occur simultaneously such that the gate electrodes 124 in each region are formed of the same material(s). In some embodiments, the gate dielectrics 122 in each region may be formed by distinct processes, such that the gate dielectrics 122 may include different materials and/or have a different number of layers, and/or the gate electrodes 124 in each region may be formed by distinct processes, such that the gate electrodes 124 may include different materials and/or have a different number of layers. Various masking steps may be used to mask and expose appropriate regions when using distinct processes.

Figure 21A:
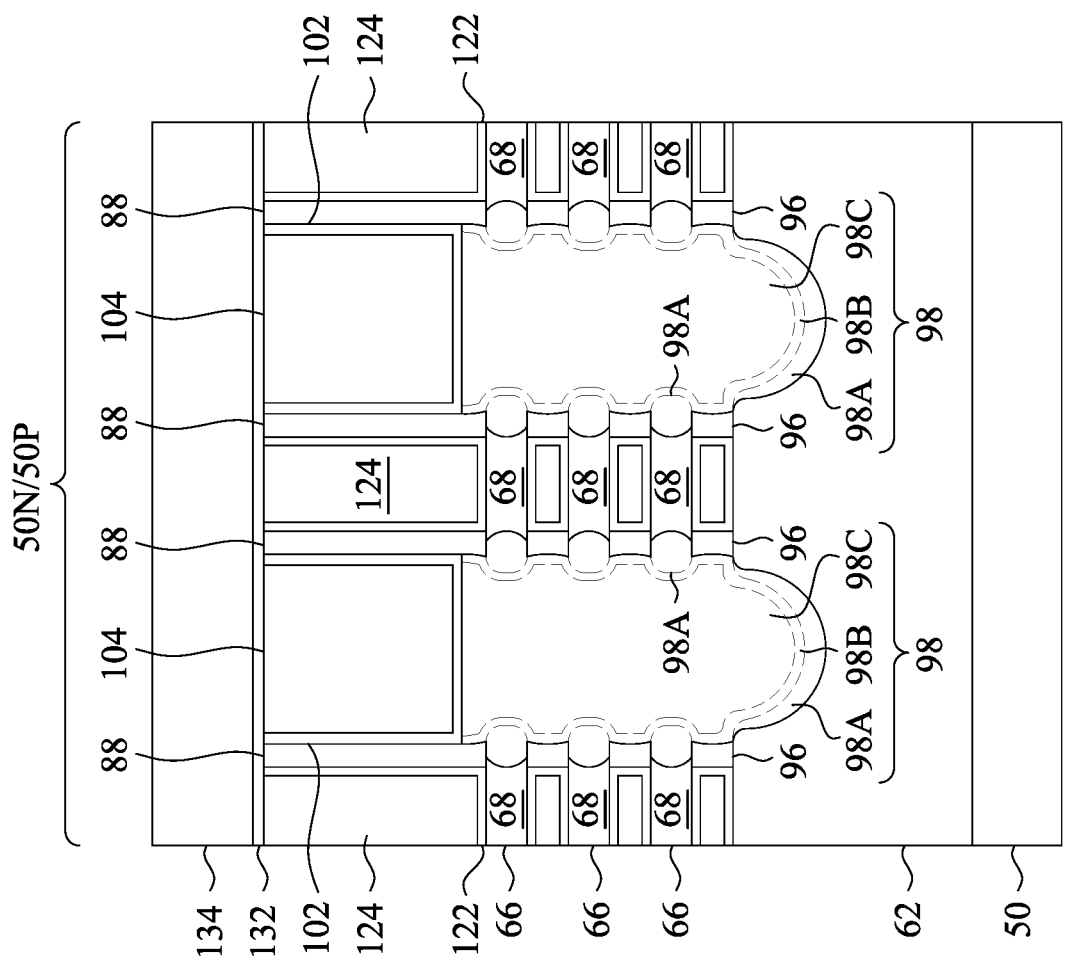
Figure 21C:
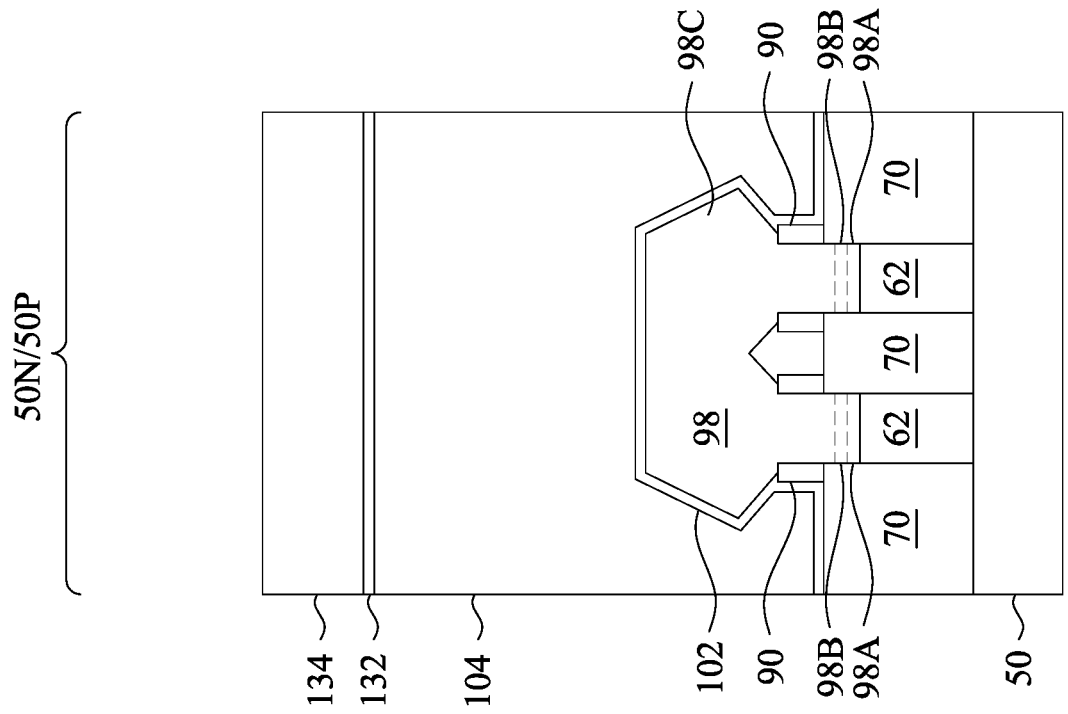
Figure 21B:
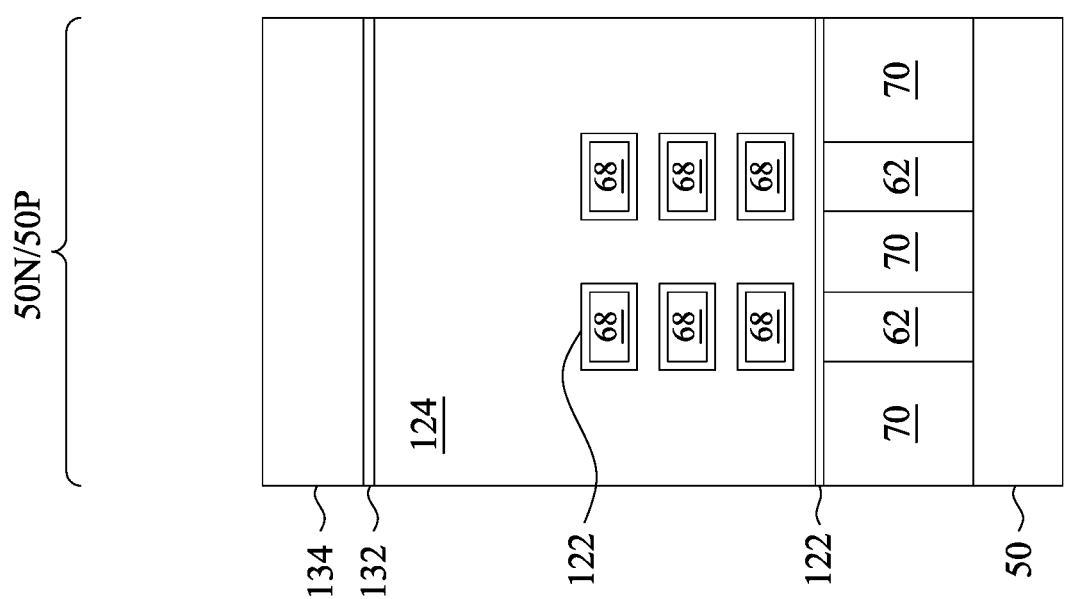

In FIGS. 21A-21C, a second ILD 134 is formed over the gate spacers 88, the CESL 102, the first ILD 104, the gate dielectrics 122, and the gate electrodes 124. In some embodiments, the second ILD 134 is a flowable film formed by a flowable CVD method. In some embodiments, the second ILD 134 is formed of a dielectric material such as PSG, BSG, BPSG, USG, or the like, which may be deposited by any suitable method, such as CVD, PECVD, or the like.

In some embodiments, an etch stop layer (ESL) 132 is formed between the second ILD 134 and the gate spacers 88, the CESL 102, the first ILD 104, the gate dielectrics 122, and the gate electrodes 124. The ESL 132 may include a dielectric material, such as, silicon nitride, silicon oxide, silicon oxynitride, or the like, having a high etching selectivity from the etching of the second ILD 134.

Figure 22A:
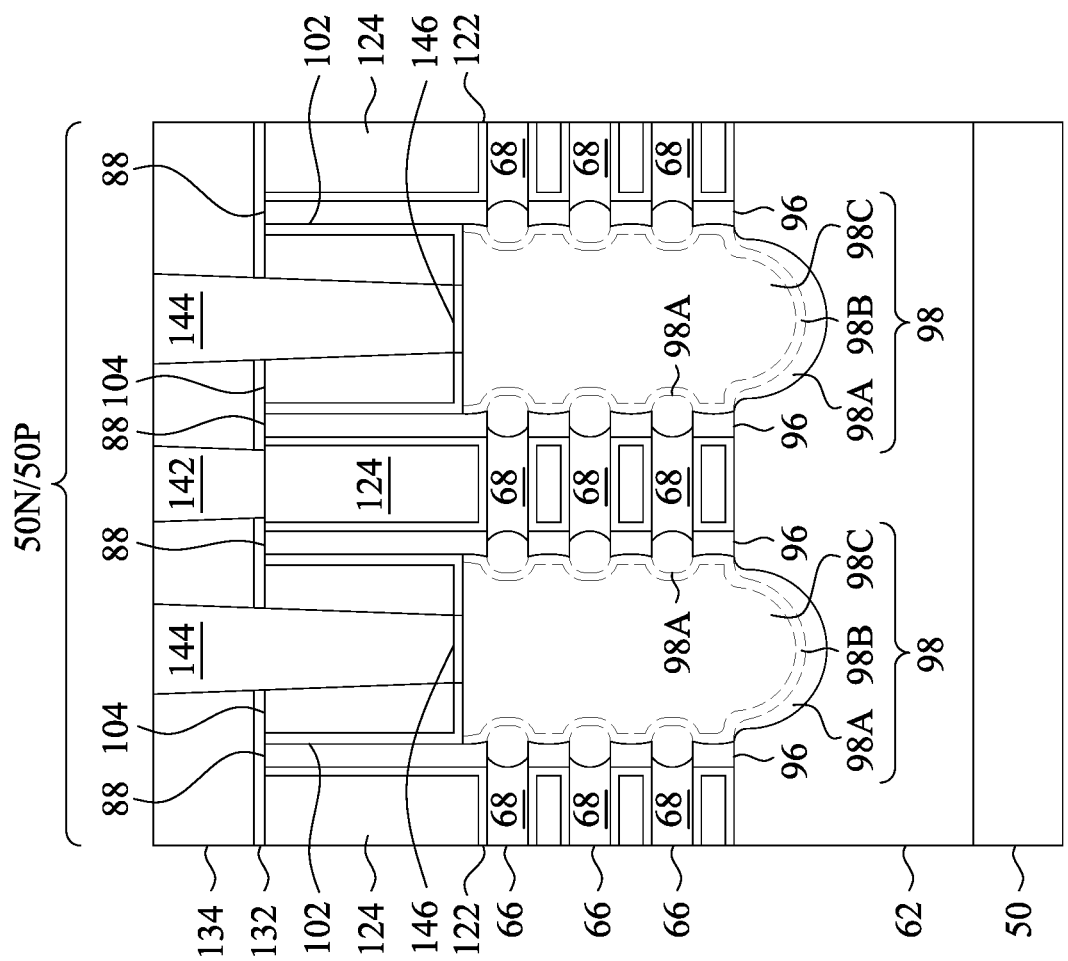
Figure 22C:
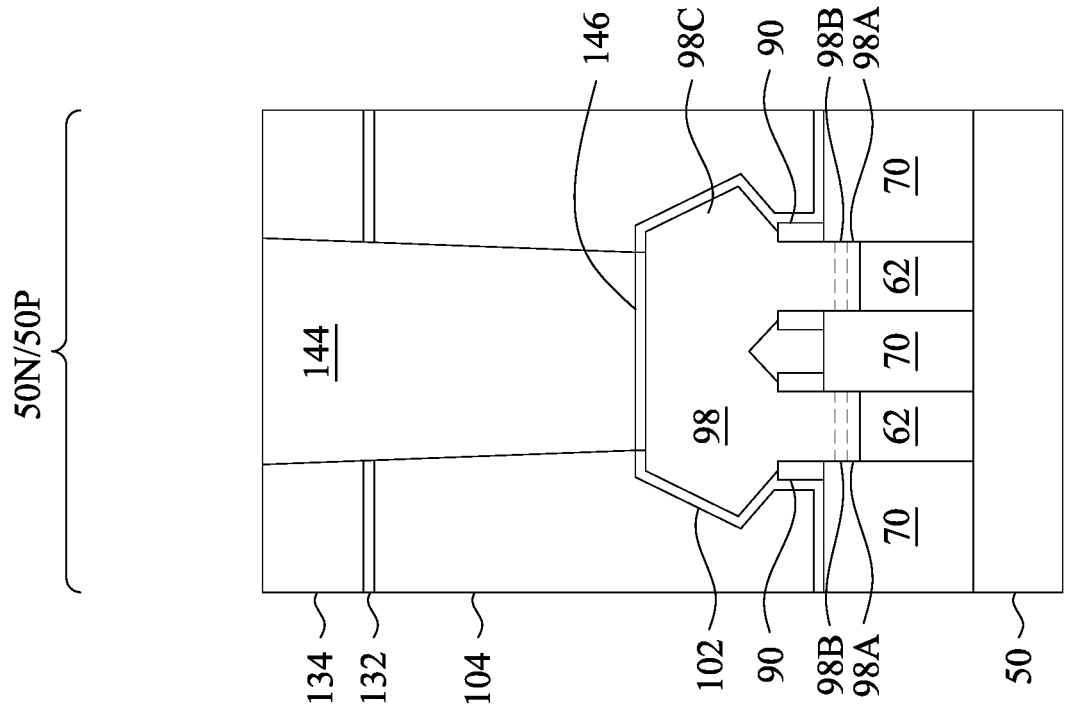
Figure 22B:
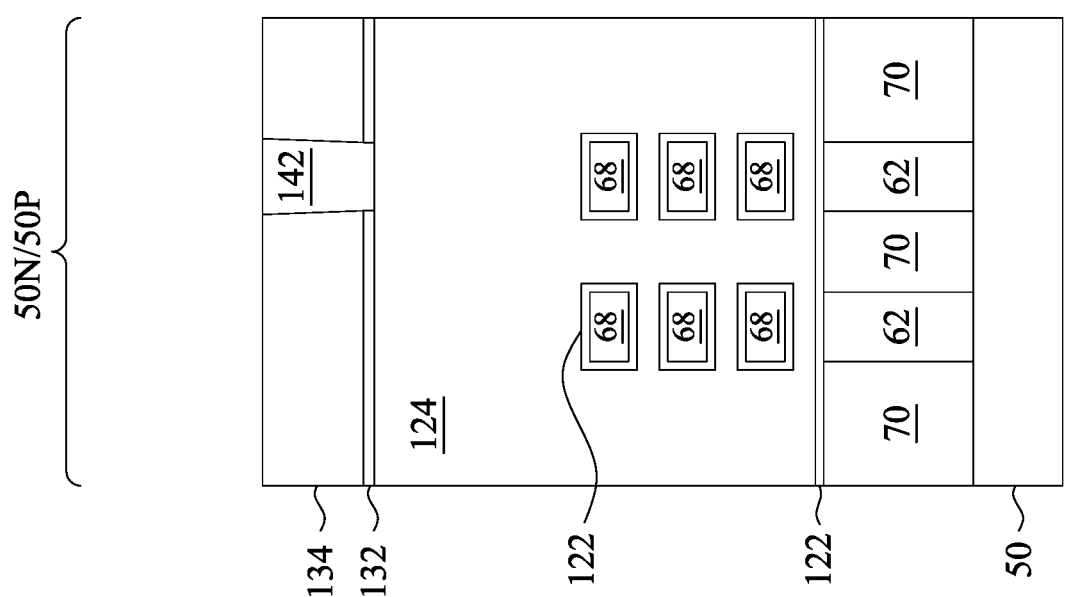

In FIGS. 22A-22C, gate contacts 142 and source/drain contacts 144 are formed to contact, respectively, the gate electrodes 124 and the epitaxial source/drain regions 98. The gate contacts 142 are physically and electrically coupled to the gate electrodes 124. The source/drain contacts 144 are physically and electrically coupled to the epitaxial source/drain regions 98.

As an example to form the gate contacts 142 and the source/drain contacts 144, openings for the gate contacts 142 are formed through the second ILD 134 and the ESL 132, and openings for the source/drain contacts 144 are formed through the second ILD 134, the ESL 132, the first ILD 104, and the CESL 102. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 134. The remaining liner and conductive material form the gate contacts 142 and the source/drain contacts 144 in the openings. The gate contacts 142 and the source/drain contacts 144 may be formed in distinct processes, or may be formed in the same process. Although shown as being formed in the same cross-sections, it should be appreciated that each of the gate contacts 142 and the source/drain contacts 144 may be formed in different cross-sections, which may avoid shorting of the contacts.

Optionally, metal-semiconductor alloy regions 146 are formed at the interfaces between the epitaxial source/drain regions 98 and the source/drain contacts 144. The metal-semiconductor alloy regions 146 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 146 can be formed before the material(s) of the source/drain contacts 144 by depositing a metal in the openings for the source/drain contacts 144 and then performing a thermal anneal process. The metal can be any metal capable of reacting with the semiconductor materials (e.g., silicon, silicon carbide, silicon germanium, germanium, etc.) of the epitaxial source/drain regions 98 to form a low-resistance metal-semiconductor alloy, such as nickel, cobalt, titanium, tantalum, platinum, tungsten, other noble metals, other refractory metals, rare earth metals or their alloys. The metal may be deposited by a deposition process such as ALD, CVD, PVD, or the like. After the thermal anneal process, a cleaning process, such as a wet clean, may be performed to remove any residual metal from the openings for the source/drain contacts 144, such as from surfaces of the metal-semiconductor alloy regions 146. The material(s) of the source/drain contacts 144 can then be formed on the metal-semiconductor alloy regions 146.

Subsequently, the nano-FET devices may be interconnected by metallization layers in an overlying interconnect structure to form integrated circuits. The overlying interconnect structure can be formed in a back end of line (BEOL) process, in which the metallization layers are connected to the gate contacts 142 and the source/drain contacts 144. In some types of devices, such as memory devices, the source/drain contacts 144 to source regions of the devices may be connected to ground. Additional features, such as passive devices, memories (e.g., magnetoresistive random-access memory (MRAM), resistive random access memory (RRAM), phase-change random access memory (PCRAM), etc.), or the like may be integrated with the interconnect structure during the BEOL process.

Figure 23:
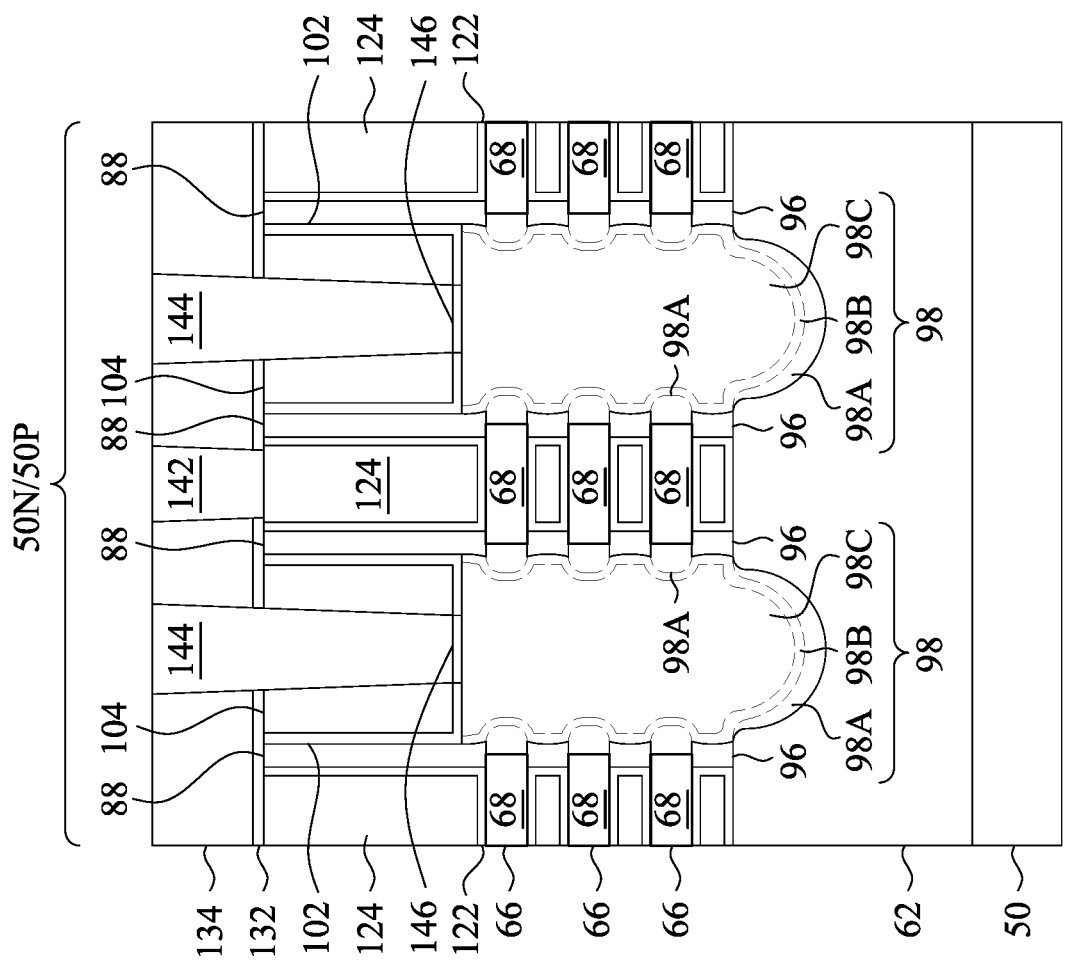
FIG. 23 is a view of nano-FETs, in accordance with some other embodiments.

FIG. 23 is a view of nano-FETs, in accordance with some other embodiments. This embodiment is similar to that described for FIG. 22A, except the second nanostructures 66 have straight sidewalls. The sidewall shape of the second nanostructures 66 may be controlled by adjusting the duration of the etch used to form sidewall recesses 92S (described for FIG. 13). The second nanostructures 66 may be formed with straight sidewalls by performing that etch for a longer duration than that used to form the second nanostructures 66 of FIG. 22A. In some embodiments, the second nanostructures 66 are etched for a duration in the range of 25 seconds to 70 seconds.

Figure 24:
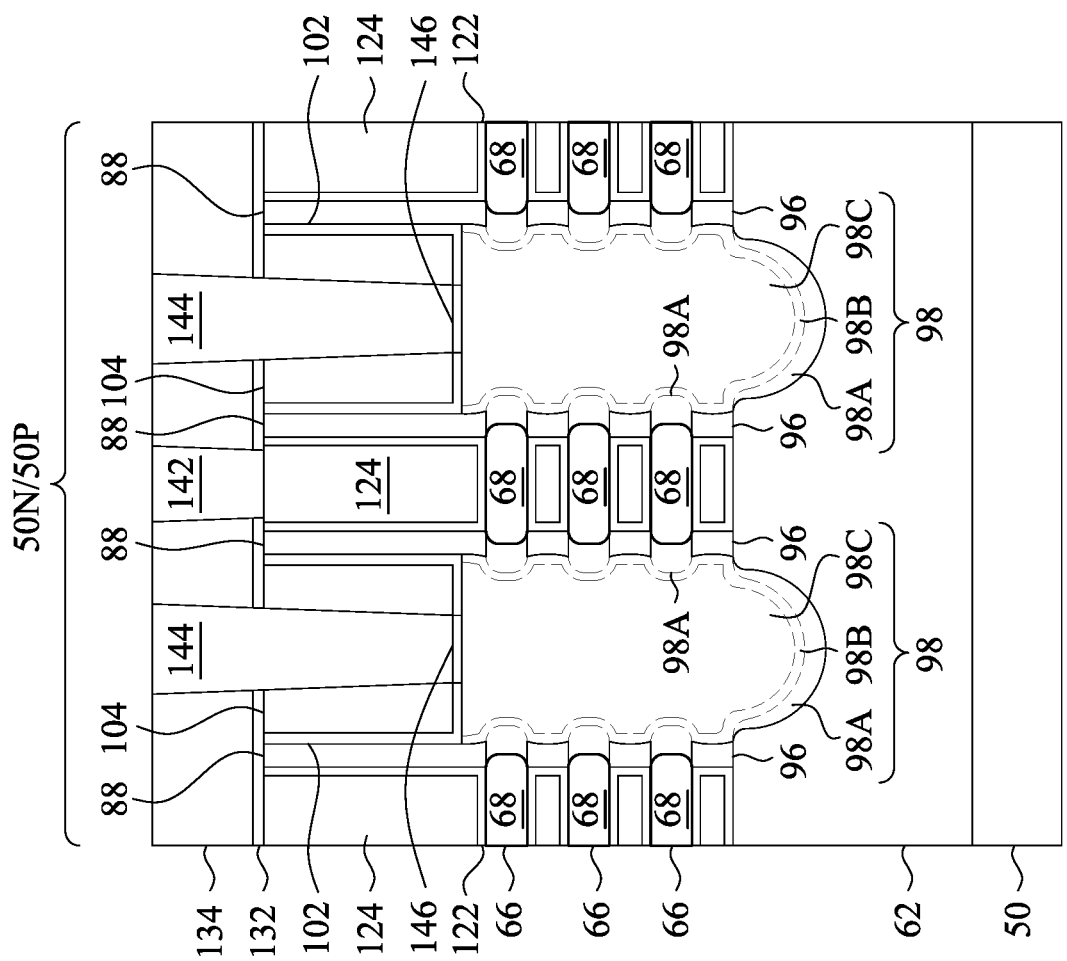
FIG. 24 is a view of nano-FETs, in accordance with some other embodiments.

FIG. 24 is a view of nano-FETs, in accordance with some other embodiments. This embodiment is similar to that described for FIG. 22A, except the second nanostructures 66 have convex sidewalls. The second nanostructures 66 may be formed with convex sidewalls by performing the etch used to form sidewall recesses 92S (described for FIG. 13) for a longer duration than that used to form the second nanostructures 66 of FIG. 23. In some embodiments, the second nanostructures 66 are etched for a duration in the range of 35 seconds to 80 seconds.

Embodiments may achieve advantages. Growing the liner layers 98B from the seed layers 98A instead of from the fins 62 allows the bottom-up growth rate of the liner layers 98B to be decreased. As such, the thickness of the liner layers 98B at the bottom of the epitaxial source/drain regions 98 may be reduced. The volume available in the source/drain recesses 92 for highly-doped epitaxial layers may thus be increased. The resistance of the epitaxial source/drain regions 98 may therefore be decreased, improving device performance. Further, the seed layers 98A may also help reduce out-diffusion of p-type dopants into the channel regions 68. Diffusion of dopants into the channel regions 68 may thus be reduced, decreasing the resistance of the channel regions 68 and further improving device performance.

In an embodiment, a device includes: a nanostructure; and a source/drain region adjoining a channel region of the nanostructure, the source/drain region including: a first epitaxial layer on a sidewall of the nanostructure, the first epitaxial layer including a germanium-free semiconductor material and a p-type dopant; a second epitaxial layer on the first epitaxial layer, the second epitaxial layer including a germanium-containing semiconductor material and the p-type dopant; and a third epitaxial layer on the second epitaxial layer, the third epitaxial layer including the germanium-containing semiconductor material and the p-type dopant. In some embodiments, the device further includes:

a gate structure wrapped around the channel region of the nanostructure; and a spacer between the gate structure and the source/drain region, a sidewall of the spacer disposed further from gate structure than the sidewall of the nanostructure. In some embodiments of the device, a sidewall of the first epitaxial layer of the source/drain region is disposed further from the gate structure than the sidewall of the spacer. In some embodiments of the device, the second epitaxial layer of the source/drain region contacts the spacer. In some embodiments of the device, the sidewall of the nanostructure is a concave sidewall. In some embodiments of the device, the sidewall of the nanostructure is a straight sidewall. In some embodiments of the device, the sidewall of the nano structure is a convex sidewall.

In an embodiment, a device includes: a fin extending from a substrate; a nanostructure over the fin; a source/drain region including: a liner layer, the liner layer including boron-doped silicon germanium; a first seed layer between the liner layer and the nanostructure, the first seed layer including boron-doped silicon; and a second seed layer between the liner layer and the fin, the second seed layer including boron-doped silicon. In some embodiments of the device, the first seed layer and the second seed layer have a greater boron concentration than the liner layer. In some embodiments of the device, the first seed layer has a first thickness, the second seed layer has a second thickness, the second thickness is greater than the first thickness, and a ratio of the second thickness to the first thickness is less than 2. In some embodiments of the device, the source/drain region further includes: a main layer on the liner layer, where the liner layer includes $Si_{1-x}Ge_x$:B, the main layer includes $Si_{1-y}Ge_y$:B, and x is less than y. In some embodiments, the device further includes: a gate structure wrapped around the nanostructure; and a spacer between the gate structure and the source/drain region, the liner layer contacting a sidewall of the spacer, the sidewall of the spacer being free of the first seed layer and the second seed layer.

In an embodiment, a method includes: etching a source/drain recess in a nanostructure and a fin; growing first epitaxial layers from a sidewall of the nanostructure and a top surface of the fin in the source/drain recess; growing a second epitaxial layer from the first epitaxial layers with a growth process, the growth process having a first bottom-up growth rate from the first epitaxial layers and having a second bottom-up growth rate from the fin and the nanostructure, the first bottom-up growth rate less than the second bottom-up growth rate; and growing a third epitaxial layer from the second epitaxial layer. In some embodiments of the method, the growth process has a lateral growth rate from the first epitaxial layers, a ratio of the first bottom-up growth rate to the lateral growth rate being in a range of 1 to 3. In some embodiments of the method, the first epitaxial layers include boron-doped silicon, the second epitaxial layer includes boron-doped silicon germanium, and the third epitaxial layer includes boron-doped silicon germanium. In some embodiments of the method, growing the first epitaxial layers includes: exposing the nanostructure and the fin to a silane, diborane, and hydrochloric acid at a temperature in a range of 600° C. to 700° C. and at a pressure in a range of 20 Torr to 50 Torr. In some embodiments of the method, growing the second epitaxial layer includes: exposing the first epitaxial layers to a silane, a germane, diborane, and hydrochloric acid at a temperature in a range of 580° C. to 680° C. and at a pressure in a range of 20 Torr to 50 Torr. In some embodiments of the method, a first germanium concentration of the first epitaxial layers is less than a second germanium concentration of the second epitaxial layer. In some embodiments of the method, a third germanium concentration of the third epitaxial layer is greater than the second germanium concentration of the second epitaxial layer. In some embodiments, the method further includes: forming a spacer between the nanostructure and the fin in the source/drain recess, the sidewall of the nanostructure recessed from a sidewall of the spacer, the first epitaxial layers grown until a sidewall of the first epitaxial layers extends beyond the sidewall of the spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
  etching a source/drain recess in a nanostructure and a fin;
  growing first epitaxial layers from a sidewall of the nanostructure and a top surface of the fin in the source/drain recess;
  growing a second epitaxial layer from the first epitaxial layers with a growth process, the growth process having a first bottom-up growth rate from the first epitaxial layers and having a second bottom-up growth rate from the fin and the nanostructure, the first bottom-up growth rate less than the second bottom-up growth rate; and
  growing a third epitaxial layer from the second epitaxial layer.

2. The method of claim 1, wherein the growth process has a lateral growth rate from the first epitaxial layers, a ratio of the first bottom-up growth rate to the lateral growth rate being in a range of 1 to 3.

3. The method of claim 1, wherein the first epitaxial layers comprise boron-doped silicon, the second epitaxial layer comprises boron-doped silicon germanium, and the third epitaxial layer comprises boron-doped silicon germanium.

4. The method of claim 3, wherein growing the first epitaxial layers comprises:
  exposing the nanostructure and the fin to a silane, diborane, and hydrochloric acid at a temperature in a range of 600° ° C. to 700° C. and at a pressure in a range of 20 Torr to 50 Torr.

5. The method of claim 3, wherein growing the second epitaxial layer comprises:
  exposing the first epitaxial layers to a silane, a germane, diborane, and hydrochloric acid at a temperature in a range of 580° ° C. to 680° C. and at a pressure in a range of 20 Torr to 50 Torr.

6. The method of claim 1, wherein a first germanium concentration of the first epitaxial layers is less than a second germanium concentration of the second epitaxial layer.

7. The method of claim 6, wherein a third germanium concentration of the third epitaxial layer is greater than the second germanium concentration of the second epitaxial layer.

8. The method of claim 1, further comprising:
  forming a spacer between the nanostructure and the fin in the source/drain recess, the sidewall of the nanostructure recessed from a sidewall of the spacer, the first epitaxial layers grown until a sidewall of the first epitaxial layers extends beyond the sidewall of the spacer.

9. A method comprising:
etching a source/drain recess in a fin;
growing an epitaxial seed layer from a top surface of the fin in the source/drain recess with a first growth process, a material of the epitaxial seed layer having a first bottom-up growth rate from a material of the fin in the first growth process;
growing an epitaxial liner layer from the epitaxial seed layer with a second growth process, a material of the epitaxial liner layer having a second bottom-up growth rate from the material of the epitaxial seed layer in the second growth process, the material of the epitaxial liner layer having a third bottom-up growth rate from the material of the fin in the second growth process, the first bottom-up growth rate being less than the third bottom-up growth rate, the second bottom-up growth rate being less than the third bottom-up growth rate; and
growing an epitaxial main layer from the epitaxial liner layer.

10. The method of claim 9, wherein a thickness of the epitaxial seed layer is less than a thickness of the epitaxial liner layer.

11. The method of claim 9, wherein the epitaxial seed layer comprises boron-doped silicon, the epitaxial liner layer comprises boron-doped silicon germanium, and the epitaxial main layer comprises boron-doped silicon germanium.

12. The method of claim 11, wherein growing the epitaxial seed layer comprises:
exposing the fin to a silane, diborane, and hydrochloric acid.

13. The method of claim 11, wherein growing the epitaxial liner layer comprises:
exposing the epitaxial seed layer to a silane, a germane, diborane, and hydrochloric acid.

14. The method of claim 9, wherein the epitaxial seed layer has a lesser germanium concentration than the epitaxial liner layer.

15. The method of claim 9, wherein the epitaxial seed layer has a greater dopant concentration than the epitaxial liner layer.

16. A method comprising:
forming a source/drain region adjacent a nanostructure and a spacer by:
growing a first epitaxial layer from a sidewall of the nanostructure, the first epitaxial layer comprising a germanium-free semiconductor material and a p-type dopant;
growing a second epitaxial layer from the first epitaxial layer, the second epitaxial layer comprising a germanium-containing semiconductor material and the p-type dopant; and
growing a third epitaxial layer from the second epitaxial layer, the third epitaxial layer comprising the germanium-containing semiconductor material and the p-type dopant.

17. The method of claim 16, wherein a sidewall of the spacer is uncovered by the first epitaxial layer and the sidewall of the spacer is covered by the second epitaxial layer.

18. The method of claim 16, wherein a sidewall of the first epitaxial layer extends beyond a sidewall of the spacer.

19. The method of claim 16, wherein the third epitaxial layer has a greater concentration of the p-type dopant than the first epitaxial layer and the second epitaxial layer.

20. The method of claim 16, further comprising:
forming a gate structure around the nanostructure, the spacer disposed between the gate structure and the source/drain region.

* * * * *